US009929529B2

(12) United States Patent
Onose et al.

(10) Patent No.: US 9,929,529 B2
(45) Date of Patent: Mar. 27, 2018

(54) SOLID-STATE LASER SYSTEM AND LASER APPARATUS USED FOR EXPOSURE APPARATUS

(71) Applicant: GIGAPHOTON INC., Tochigi (JP)

(72) Inventors: Takashi Onose, Tochigi (JP); Osamu Wakabayashi, Tochigi (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/672,754

(22) Filed: Aug. 9, 2017

(65) Prior Publication Data
US 2017/0338619 A1 Nov. 23, 2017

Related U.S. Application Data

(63) Continuation of application No. PCT/JP2015/056654, filed on Mar. 6, 2015.

(51) Int. Cl.
*G02F 1/35* (2006.01)
*H01S 3/10* (2006.01)
(Continued)

(52) U.S. Cl.
CPC ............... *H01S 3/10* (2013.01); *G02F 1/37* (2013.01); *H01S 3/23* (2013.01)

(58) Field of Classification Search
CPC ..................................... G02F 1/37; H01S 3/23
(Continued)

(56) References Cited

U.S. PATENT DOCUMENTS 7,593,440 B2    9/2009  Spinelli et al.
7,970,024 B2    6/2011  Heine et al.
(Continued)

FOREIGN PATENT DOCUMENTS

JP    11-298083    * 10/1999
JP    H11-298083 A  10/1999
(Continued)

OTHER PUBLICATIONS

International Search Report issued in PCT/JP2015/056654; dated Jun. 2, 2015.
(Continued)

*Primary Examiner* — Tuan Nguyen
(74) *Attorney, Agent, or Firm* — Studebaker & Brackett PC

(57) ABSTRACT

A solid-state laser system may include a first solid-state laser unit, a second solid-state laser unit, a wavelength conversion system, a wavelength detector, and a wavelength controller. The wavelength conversion system may receive a first pulsed laser light beam with a first wavelength and a second pulsed laser light beam with a second wavelength, and output a third pulsed laser light beam with a third wavelength converted from the first and second wavelengths. The wavelength controller may control the first solid-state laser unit to vary the first wavelength on a condition that an absolute value of a difference between a value of a target wavelength and a value of the third wavelength detected by the wavelength detector is equal to or less than a predetermined value, and control the second solid-state laser unit to vary the second wavelength on a condition that the absolute value exceeds the predetermined value.

18 Claims, 22 Drawing Sheets

(51) Int. Cl.
*G02F 1/37* (2006.01)
*H01S 3/23* (2006.01)

(58) Field of Classification Search
USPC .......................................................... 372/20
See application file for complete search history.

(56) References Cited

U.S. PATENT DOCUMENTS

| | | | |
|---|---|---|---|
| 7,999,915 B2 | 8/2011 | Ershov et al. | |
| 8,416,831 B2 | 4/2013 | Heine et al. | |
| 8,625,645 B2 * | 1/2014 | Wakabayashi | H01S 5/0085 372/29.011 |
| 8,717,665 B2 * | 5/2014 | Gerbier | G02F 1/3501 359/326 |
| 2013/0170508 A1 | 7/2013 | Suzuki et al. | |
| 2013/0279526 A1 * | 10/2013 | Kakizaki | H01S 3/10 372/5 |

FOREIGN PATENT DOCUMENTS

| | | | |
|---|---|---|---|
| JP | 2003-161974 | * | 6/2003 |
| JP | 2003-161974 A | | 6/2003 |
| JP | 2011-522296 | * | 7/2011 |
| JP | 2011-522296 A | | 7/2011 |
| JP | 2013-222173 A | | 10/2013 |
| WO | 2011/148895 A1 | | 12/2011 |
| WO | WO 2011/148895 | * | 12/2011 |

OTHER PUBLICATIONS

International Preliminary Report on Patentability issued in PCT/JP2015/056654; dated Sep. 12, 2017.

* cited by examiner

SOLID-STATE LASER SYSTEM AND LASER APPARATUS USED FOR EXPOSURE APPARATUS

CROSS REFERENCE TO RELATED APPLICATIONS

The present application is a continuation application of International Application No. PCT/JP2015/056654 filed on Mar. 6, 2015. The content of the application is incorporated herein by reference in its entirety.

BACKGROUND

1. Technical Field

The present disclosure relates to a solid-state laser system that generates a pulsed laser light beam and a laser apparatus used for an exposure apparatus.

2. Related Art

With miniaturization and high integration of a semiconductor integrated circuit, an improvement in resolution has been demanded for a semiconductor exposure apparatus. Hereinafter, the semiconductor exposure apparatus is simply referred to as an "exposure apparatus". Shortening in a wavelength of light to be outputted from an exposure light source has been in progress accordingly. A gas laser unit is used in place of an existing mercury lamp for the exposure light source. Currently, a KrF excimer laser unit and an ArF excimer laser unit may be used as gas laser units for exposure. The KrF excimer laser unit may output ultraviolet light with a wavelength of 248 nm, and the ArF excimer laser unit may output ultraviolet light with a wavelength of 193.4 nm.

As current exposure technology, liquid immersion exposure is practically used. In the liquid immersion exposure, a clearance between a projection lens on exposure apparatus side and a wafer is filled with a liquid to change a refractive index of the clearance, thereby shortening an apparent wavelength of light from the exposure light source. When the liquid immersion exposure is performed with use of the ArF excimer laser unit as the exposure light source, ultraviolet light with a wavelength of 134 nm in water is applied to the wafer. This technology is referred to as "ArF liquid immersion exposure". The ArF liquid immersion exposure is also referred to as "ArF liquid immersion lithography".

Since a spectral line width in free oscillation of each of the KrF excimer laser unit and the ArF excimer laser unit is wide, e.g., in a range of about 350 pm to about 400 pm, color aberration of laser light (ultraviolet light) that is reduced and projected on the wafer by the projection lens on the exposure apparatus side occurs, which results in decrease in resolution. It is therefore necessary to narrow a spectral line width of laser light to be outputted from the gas laser unit to an extent in which the color aberration is negligible. The spectral line width is also referred to as "spectral width". Accordingly, a line narrow module including a line narrowing device is provided in a laser resonator of the gas laser unit, which achieves narrowing of the spectral width. Non-limiting examples of the line narrowing device may include an etalon and a grating. The laser unit narrowed in spectral width in this way is referred to as "line narrowing laser unit". For example, reference is made to Japanese Unexamined Patent Application Publication No. H11-298083, U.S. Patent Application Publication No. 2013/0170508, U.S. Pat. No. 7,593,440, U.S. Pat. No. 7,999,915, U.S. Pat. No. 7,970,024, U.S. Pat. No. 8,416,831, Japanese Unexamined Patent Application Publication No. 2013-222173, and U.S. Patent Application Publication No. 2013/0279526.

SUMMARY

A solid-state laser system according to an aspect of the present disclosure may include a first solid-state laser unit, a second solid-state laser unit, a wavelength conversion system, a wavelength detector, and a wavelength controller. The first solid-state laser unit may be configured to output a first pulsed laser light beam with a first wavelength generated on a basis of first seed light. The second solid-state laser unit may be configured to output a second pulsed laser light beam with a second wavelength generated on a basis of second seed light. The wavelength conversion system may be configured to receive the first pulsed laser light beam and the second pulsed laser light beam, and output a third pulsed laser light beam with a third wavelength that is converted from the first wavelength and the second wavelength. The wavelength detector may be configured to detect a value of the third wavelength. The wavelength controller may be configured to control the first solid-state laser unit to vary the first wavelength on a condition that an absolute value of a difference between a value of a target wavelength and the value of the third wavelength detected by the wavelength detector is equal to or less than a predetermined value, and control the second solid-state laser unit to vary the second wavelength on a condition that the absolute value of the difference exceeds the predetermined value.

A laser apparatus according to an aspect of the present disclosure may be used for an exposure apparatus, and may include a first solid-state laser unit, a second solid-state laser unit, a wavelength conversion system, a wavelength detector, a wavelength controller, and an amplifier. The first solid-state laser unit may be configured to output a first pulsed laser light beam with a first wavelength generated on a basis of first seed light. The second solid-state laser unit may be configured to output a second pulsed laser light beam with a second wavelength generated on a basis of second seed light. The wavelength conversion system may be configured to receive the first pulsed laser light beam and the second pulsed laser light beam, and output a third pulsed laser light beam with a third wavelength that is converted from the first wavelength and the second wavelength. The wavelength detector may be configured to detect a value of the third wavelength. The wavelength controller may be configured to control the first solid-state laser unit to vary the first wavelength on a condition that an absolute value of a difference between a value of a target wavelength and the value of the third wavelength detected by the wavelength detector is equal to or less than a predetermined value, and control the second solid-state laser unit to vary the second wavelength on a condition that the absolute value of the difference exceeds the predetermined value. The amplifier may be provided in an optical path of the third pulsed laser light beam.

BRIEF DESCRIPTION OF THE DRAWINGS

Some example embodiments of the present disclosure are described below as mere examples with reference to the accompanying drawings.

DETAILED DESCRIPTION

Figure 1:
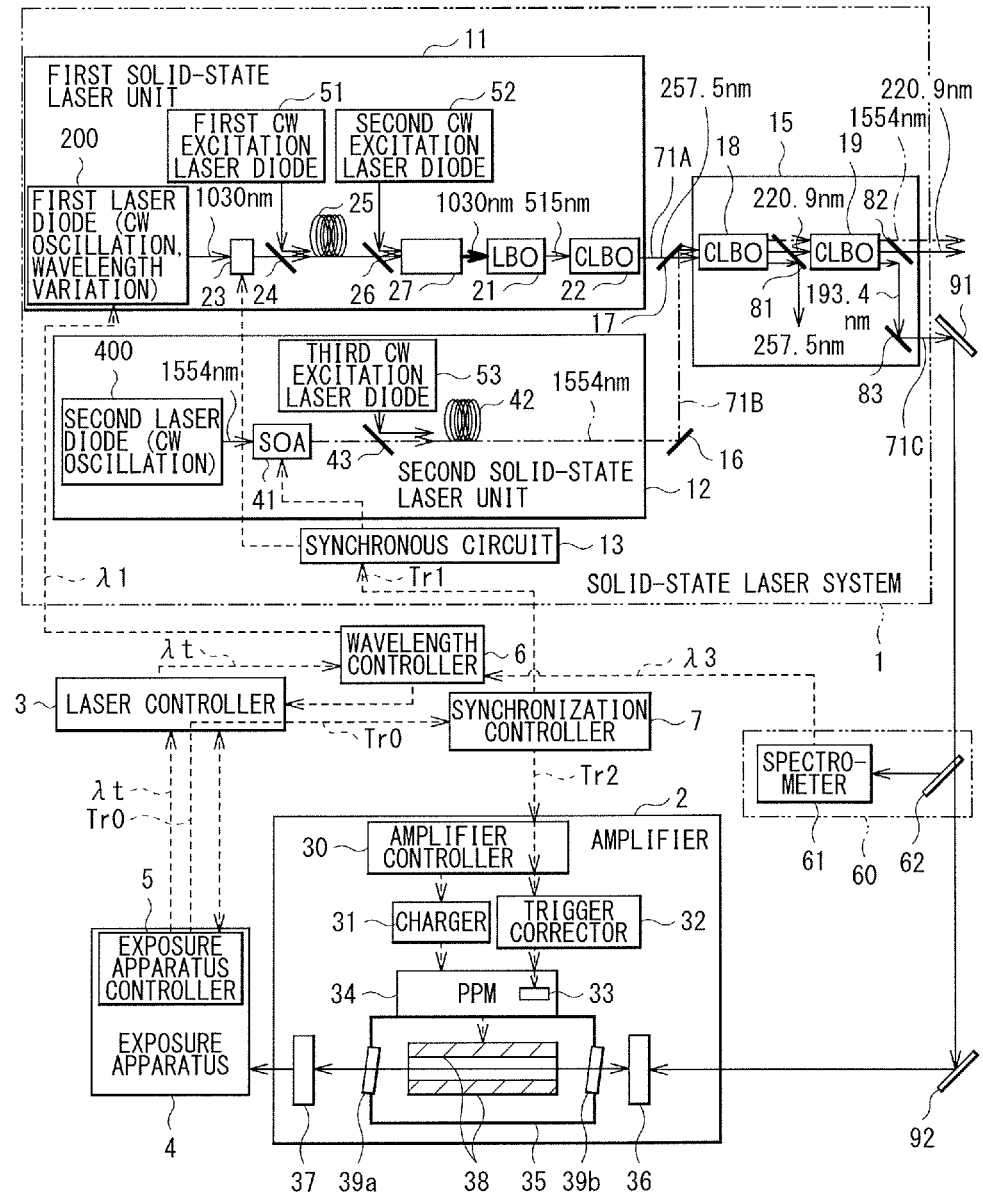
FIG. 1 schematically illustrates a configuration example of a laser apparatus that is used for an exposure apparatus and includes a solid-state laser system according to a comparative example.

<Contents>
[1. Overview]
[2. Comparative Example] (Laser apparatus that is used for an exposure apparatus and includes a solid-state laser system)
  2.1 Configuration (FIG. 1)
  2.2 Operation
  2.3 Issues
[3. First Embodiment] (Laser apparatus that is used for an exposure apparatus and includes a solid-state laser system)
  3.1 Configuration (FIG. 2)
  3.2 Operation (FIGS. 3 to 7)
  3.3 Workings
  3.4 Modification Examples
    3.4.1 First Modification Example (FIG. 8)
    3.4.2 Second Modification Example (FIG. 9)
[4. Second Embodiment] (Laser apparatus that is used for an exposure apparatus and includes a solid-state laser system)
  4.1 Configuration (FIG. 10)
  4.2 Operation (FIG. 11)
  4.3 Workings
[5. Third Embodiment] (Laser apparatus that is used for an exposure apparatus and includes a solid-state laser system)
  5.1 Configuration (FIG. 12)
  5.2 Operation (FIGS. 13 to 16)
  5.3 Workings
[6. Wavelength Tunable Laser Diode]
  6.1 Fine Wavelength Tunable Laser Diode (FIG. 17)
    6.1.1 Configuration
    6.1.2 Operation
  6.2 Coarse Wavelength Tunable Laser Diode (FIGS. 18 and 19)
    6.2.1 Configuration
    6.2.2 Operation
[7. Wavelength Monitor] (FIGS. 20 and 21)
  7.1 Configuration
  7.2 Operation
[8. Hardware Environment of Controller] (FIG. 22)
[9. Et Cetera]

In the following, some example embodiments of the present disclosure are described in detail with reference to the drawings. Example embodiments described below each illustrate one example of the present disclosure and are not intended to limit the contents of the present disclosure. Further, all of the configurations and operations described in each example embodiment are not necessarily essential for the configurations and operations of the present disclosure. Note that like components are denoted by like reference numerals, and redundant description thereof is omitted.

1. Overview

The present disclosure relates to a solid-state laser system that generates, for example, a pulsed laser light beam, and a laser apparatus used for an exposure apparatus.

2. Comparative Example

First, description is given of a laser apparatus that is used for an exposure apparatus and includes a solid-state laser system according to a comparative example with respect to example embodiments of the present disclosure.

The laser apparatus used for the exposure apparatus may have a configuration including a master oscillator (MO) and a power oscillator (PO). In such a laser apparatus used for the exposure apparatus, a laser using an excimer laser gas as a laser medium may be used for the MO and the PO. However, in term of energy saving, development of a laser apparatus that is used for an exposure apparatus and includes a solid-state laser system as an MO is in progress. The solid-state laser system is configured of a combination of a nonlinear crystal and a solid-state laser, and outputs a pulsed laser light beam of ultraviolet light. In the following, description is given of a configuration example of the laser apparatus that is used for the exposure apparatus and includes such a solid-state laser system.

2.1 Configuration

FIG. 1 schematically illustrates a configuration example of the laser apparatus used for the exposure apparatus according to the comparative example with respect to example embodiments of the present disclosure.

The laser apparatus used for the exposure apparatus may include a solid-state laser system 1, an amplifier 2, a laser controller 3, a wavelength controller 6, a synchronization controller 7, a wavelength monitor 60, and high reflection mirrors 91 and 92.

The solid-state laser system 1 may include a first solid-state laser unit 11, a second solid-state laser unit 12, a synchronous circuit 13, a wavelength conversion system 15, a high reflection mirror 16, and a dichroic mirror 17.

The first solid-state laser unit 11 may be configured to output a first pulsed laser light beam 71A with a first wavelength toward the wavelength conversion system 15 via the dichroic mirror 17. The first pulsed laser light beam 71A may be generated on the basis of first seed light. The first wavelength may be about 257.5 nm. The first solid-state laser unit 11 may include a first laser diode 200, an optical shutter 23, a beam splitter 24, a first fiber amplifier 25, a beam splitter 26, and a solid-state amplifier 27. The first solid-state laser unit 11 may further include a LBO ($LiB_3O_5$) crystal 21 and a CLBO ($CsLiB_6O_{10}$) crystal 22 that are nonlinear crystals, a first continuous wave (CW) excitation laser diode 51, and a second CW excitation laser diode 52. The optical shutter 23 may be configured of, for example, a combination of an electro-optical (EO) Pockels cell and a polarizer.

The first laser diode 200 may be a distributed-feedback laser diode that oscillates in a CW mode to output the first seed light with a wavelength of about 1030 nm. The first laser diode 200 may be a single longitudinal mode laser diode that varies an oscillation wavelength around a wavelength of about 1030 nm. A signal line that receives data of a setting wavelength 1 from the wavelength controller 6 may be provided to the first laser diode 200. A signal line that outputs various kinds of data and control signals from the wavelength controller 6 to the laser controller 3 may be further provided to the first laser diode 200.

The second solid-state laser unit 12 may be configured to output a second pulsed laser light beam 71B with a second wavelength toward the wavelength conversion system 15 via the high reflection mirror 16 and the dichroic mirror 17. The second pulsed laser light beam 71B may be generated on the basis of second seed light. The second wavelength may be about 1554 nm. The second solid-state laser unit 12 may include a second laser diode 400, a semiconductor optical amplifier (SOA) 41, a second fiber amplifier 42, a beam splitter 43, and a third CW excitation laser diode 53.

The second laser diode 400 may be a distributed-feedback laser diode that oscillates in a CW single longitudinal mode to output the second seed light with a wavelength of about 1554 nm.

The high reflection mirror 16 may be so disposed as to reflect the second pulsed laser light beam 71B outputted from the second solid-state laser unit 12 at high reflectivity, thereby allowing the thus-reflected second pulsed laser light beam 71B to enter the dichroic mirror 17. The dichroic mirror 17 may be coated with a film that allows the first pulsed laser light beam 71A to pass therethrough at high transmittance and reflects the second pulsed laser light beam 71B at high reflectivity. The dichroic mirror 17 may be so disposed as to allow the first pulsed laser light beam 71A and the second pulsed laser light beam 71B to enter the wavelength conversion system 15 while optical path axes of the first pulsed laser light beam 71A and the second pulsed laser light beam 71B are substantially coincident with each other.

The wavelength conversion system 15 may be configured to receive the first pulsed laser light beam 71A with the first wavelength and the second pulsed laser light beam 71B with the second wavelength at a substantially coincidental timing. The wavelength conversion system 15 may be configured to output a third pulsed laser light beam 71C with a third wavelength $\lambda 3$ that is converted from the first wavelength and the second wavelength. The third wavelength $\lambda 3$ may be about 193.4 nm.

The wavelength conversion system 15 may include two CLBO crystals 18 and 19 that are nonlinear crystals. The wavelength conversion system 15 may further include a dichroic mirror 81, a dichroic mirror 82, and a high reflection mirror 83. The CLBO crystal 18, the dichroic mirror 81, and the CLBO crystal 19 may be disposed in an optical path of a pulsed laser light beam in this order from upstream to downstream.

The first pulsed laser light beam 71A with a wavelength of about 257.5 nm and the second pulsed laser light beam 71B with a wavelength of about 1554 nm as first entering light and second entering light may enter the CLBO crystal 18. The CLBO crystal 18 may output, as converted light with a predetermined wavelength, a pulsed laser light beam with a wavelength of about 220.9 nm corresponding to a sum frequency of a wavelength of about 257.5 nm and a wavelength of about 1554 nm. The CLBO crystal 18 may further output the first pulsed laser light beam 71A with a wavelength of about 257.5 nm and the second pulsed laser light beam 71B with a wavelength of about 1554 nm.

The second pulsed laser light beam 71B with a wavelength of about 1554 nm and the pulsed laser light beam with a wavelength of about 220.9 nm as first entering light and second entering light may enter the CLBO crystal 19. The CLBO crystal 19 may output, as converted light with a predetermined wavelength, the third pulsed laser light beam 71C with the third wavelength $\lambda 3$, i.e., a wavelength of about 193.4 nm corresponding to a sum frequency of a wavelength of about 1554 nm and a wavelength of about 220.9 nm.

The dichroic mirror 81 may be coated with a film that reflects the first pulsed laser light beam 71A with a wavelength of about 257.5 nm at high reflectivity and allows the second pulsed laser light beam 71B with a wavelength of about 1554 nm and the pulsed laser light beam with a wavelength of about 220.9 nm to pass therethrough at high transmittance.

The dichroic mirror 82 may be so disposed as to allow pulsed laser light beams with wavelengths of about 1554 nm and about 220.9 nm of the three pulsed laser light beams outputted from the CLBO crystal 19 to pass therethrough at high transmittance and as to reflect the third pulsed laser light beam 71C with a wavelength of about 193.4 nm of the three pulsed laser light beams at high reflectivity.

The high reflection mirror 83 may be so disposed as to allow the third pulsed laser light beam 71C with a wavelength of about 193.4 nm to be outputted from the wavelength conversion system 15.

The laser controller 3 may be coupled to the first laser diode 200, the second laser diode 400, the first CW excitation laser diode 51, the second CW excitation laser diode 52, and the third CW excitation laser diode 53 through unillustrated signal lines.

The high reflection mirror 91 may be so disposed as to allow the third pulsed laser light beam 71C with a wavelength of about 193.4 nm to enter the high reflection mirror 92 via the wavelength monitor 60.

The wavelength monitor 60 may include a spectrometer 61 and a beam splitter 62. The beam splitter 62 may be so disposed as to reflect a part of the third pulsed laser light beam 71C with the wavelength $\lambda 3$, i.e., a wavelength of about 193.4 nm, thereby allowing the thus-reflected light beam to enter the spectrometer 61. The spectrometer 61 may be an etalon spectrometer that measures the third wavelength $\lambda 3$.

The amplifier 2 may include an amplifier controller 30, a charger 31, a trigger corrector 32, a pulsed power module (PPM) 34 including a switch 33, a chamber 35, a partial reflection mirror 36, and an output coupling mirror 37.

The chamber 35 may be provided with windows 39a and 39b. The chamber 35 may contain, for example, a laser gas containing an Ar gas, a $F_2$ gas, and a Ne gas. A pair of discharge electrodes 38 may be provided inside the chamber 35. The pair of discharge electrodes 38 may be coupled to an output terminal of the PPM 34.

In the amplifier 2, an optical resonator including the partial reflection mirror 36 and the output coupling mirror 37 may be configured. The partial reflection mirror 36 may be configured of, for example, a substrate coated with a partial reflection film having reflectivity from 70% to 90% both inclusive. The substrate may be made of a $CaF_2$ crystal that allows, for example, light with a wavelength of about 193.4 nm to pass therethrough. The output coupling mirror 37 may be configured of, for example, a substrate coated with a partial reflection film having reflectivity from 10% to 20% both inclusive. The substrate may be made of a $CaF_2$ crystal that allows, for example, light with a wavelength of about 193.4 nm to pass therethrough.

It is to be noted that FIG. 1 illustrates an example in which a Fabry-Perot resonator is provided as the amplifier 2; however, the amplifier 2 is not limited thereto. For example, a ring resonator may be provided, or a mirror that achieves multi-pass amplification may be provided.

The synchronization controller 7 may be supplied with an oscillation trigger signal Tr0 from an exposure apparatus 4 as an external apparatus via the laser controller 3. The oscillation trigger signal Tr0 may indicate a timing of generating a pulsed laser light beam in the solid-state laser system 1. The wavelength controller 6 may be further supplied with a signal from the exposure apparatus 4 via the laser controller 3. The signal may indicate a value of a target wavelength $\lambda t$ of a pulsed laser light beam in the solid-state laser system 1. The exposure apparatus 4 may include an exposure apparatus controller 5. The exposure apparatus controller 5 of the exposure apparatus 4 may supply the signal indicating the value of the target wavelength $\lambda t$ and the oscillation trigger signal Tr0. Further, a signal line that transmits and receives various kinds of data and signals may be provided between the exposure apparatus controller 5 and the laser controller 3.

The synchronization controller 7 may be configured to generate a first trigger signal Tr1 on the basis of the oscillation trigger signal Tr0 and output the first trigger signal Tr1 to the synchronous circuit 13. The synchronization controller 7 may further generate a second trigger signal Tr2 on the basis of the oscillation trigger signal Tr0 and output the second trigger signal Tr2 to the trigger corrector 32 via the amplifier controller 30.

The synchronous circuit 13 may be configured to output a predetermined trigger signal to each of the optical shutter 23 of the first solid-state laser unit 11 and the semiconductor optical amplifier 41 of the second solid-state laser unit 12 on the basis of the first trigger signal Tr1 from the synchronization controller 7.

2.2 Operation

The wavelength controller 6 may receive the signal indicating the value of the target wavelength $\lambda t$ from the exposure apparatus controller 5 via the laser controller 3. The wavelength controller 6 may transmit data of the setting wavelength $\lambda 1$ to the first laser diode 200 so as to cause the first laser diode 200 to oscillate in a CW mode, thereby causing the solid-state laser system 1 to output the third pulsed laser light beam 71C with the target wavelength $\lambda t$.

The laser controller 3 may cause the first and second CW excitation laser diodes 51 and 52, the second laser diode 400, and the third CW excitation laser diode 53 to oscillate in the CW mode on the basis of an oscillation preparation signal from the exposure apparatus controller 5. The first CW excitation laser diode 51 may output first CW-excited light, the second CW excitation laser diode 52 may output second CW-excited light, and the third CW excitation laser diode 53 may output third CW-excited light.

The synchronization controller 7 may control delay times of the first trigger signal Tr1 and the second trigger signal Tr2 upon reception of the oscillation trigger signal Tr0 from the exposure apparatus controller 5 via the laser controller 3. The delay times may be so controlled as to cause the pair of discharge electrodes 38 to be discharged in synchronization with injection of the third pulsed laser light beam 71C outputted from the solid-state laser system 1 into the optical resonator of the amplifier 2.

In the first solid-state laser unit 11, the first laser diode 200 may output CW-oscillated light with a wavelength of about 1030 nm as the first seed light. The CW-oscillated first seed light with a wavelength of about 1030 nm may be trimmed into a pulse form by the optical shutter 23 on the basis of the predetermined trigger signal from the synchronous circuit 13. Subsequently, the pulsed first seed light outputted from the optical shutter 23 and the first CW-excited light from the first CW excitation laser diode 51 may enter the first fiber amplifier 25 via the beam splitter 24. This may cause the first fiber amplifier 25 to amplify the first seed light. Thereafter, the first seed light amplified by the first fiber amplifier 25 and the second CW-excited light from the second CW excitation laser diode 52 may enter the solid-state amplifier 27 via the beam splitter 26, thereby causing the solid-state amplifier 27 to amplify the first seed light. Subsequently, the LBO crystal 21 and the CLBO crystal 22 may generate a fourth harmonic with a wavelength of about 257.5 nm from the first seed light amplified by the solid-state amplifier 27. Thus, the first solid-state laser unit 11 may output the first pulsed laser light beam 71A with a wavelength of about 257.5 nm.

In contrast, in the second solid-state laser unit 12, the second laser diode 400 may output CW-oscillated light with a wavelength of about 1554 nm as the second seed light. The second seed light may be amplified into a pulse form by the semiconductor optical amplifier 41 on the basis of the predetermined trigger signal from the synchronous circuit 13. Subsequently, the pulsed second seed light outputted from the semiconductor optical amplifier 41 and the third CW-excited light from the third CW excitation laser diode 53 may enter the second fiber amplifier 42 via the beam splitter 43. This may cause the second fiber amplifier 42 to amplify the second seed light. Thus, the second solid-state laser unit 12 may output the second pulsed laser light beam 71B with a wavelength of about 1554 nm.

In the wavelength conversion system 15, the dichroic mirror 17 may cause the first pulsed laser light beam 71A and the second pulsed laser light beam 71B to enter the CLBO crystal 18 at a substantially coincidental timing and be superimposed on each other on the CLBO crystal 18. The CLBO crystal 18 may generate a pulsed laser light beam with a wavelength of about 220.9 nm corresponding to a sum frequency of a wavelength of about 257.5 nm and a wavelength of about 1554 nm.

The dichroic mirror 81 may reflect the first pulsed laser light beam 71A with a wavelength of about 257.5 nm at high reflectivity. Moreover, the dichroic mirror 81 may allow a pulsed laser light beam with a wavelength of about 1554 nm and a pulsed laser light beam with a wavelength of about 220.9 nm to pass therethrough at high transmittance and enter the CLBO crystal 19.

The CLBO crystal 19 may generate the third pulsed laser light beam 71C with a wavelength of about 193.4 nm corresponding to a sum frequency of a wavelength of about 220.9 nm and a wavelength of about 1554 nm. The CLBO crystal 19 may output three pulsed laser light beams with wavelengths of about 220.9 nm, about 1554 nm, and about 193.4 nm.

The dichroic mirror 82 may allow the pulsed laser light beam with a wavelength of about 1554 nm and the pulsed laser light beam with a wavelength of about 220.0 nm of the three pulsed laser light beams outputted from the CLBO crystal 19 to pass therethrough at high transmittance. Moreover, the dichroic mirror 82 may reflect the third pulsed laser light beam 71C with a wavelength of about 193.4 nm at high reflectivity. The third pulsed laser light beam 71C with a wavelength of about 193.4 nm may be outputted from the wavelength conversion system 15 via the high reflection mirror 83.

The third pulsed laser light beam 71C outputted from the wavelength conversion system 15 may enter the wavelength monitor 60 via the high reflection mirror 91. In the wavelength monitor 60, the beam splitter 62 may reflect a part of the third pulsed laser light beam 71C toward the spectrometer 61 and may allow the other part of the third pulsed laser light beam 71C to pass therethrough and be outputted toward the high reflection mirror 92. The third pulsed laser light beam 71C reflected by the high reflection mirror 92 may enter the partial reflection mirror 36 of the amplifier 2.

The wavelength monitor 60 may detect a value of the third wavelength λ3 of the third pulsed laser light beam 71C having entered the spectrometer 61. The wavelength monitor 60 may output data of the value of the third wavelength λ3 detected by the spectrometer 61 to the wavelength controller 6. The wavelength controller 6 may control the setting wavelength λ1 of the first laser diode 200 and an oscillation wavelength of the first laser diode 200 so as to allow an absolute value of a difference δλ between the value of the third wavelength λ3 detected by the wavelength monitor 60 and the value of the target wavelength λt to approach zero. Thus, the third wavelength λ3 of the third pulsed laser light beam 71C may approach the target wavelength λt indicated by the exposure apparatus 4.

The second trigger signal Tr2 from the synchronization controller 7 may be inputted to the amplifier controller 30. The second trigger signal Tr2 may be also inputted to the switch 33 of the PPM 34 via the amplifier controller 30 and the trigger corrector 32.

The third pulsed laser light beam 71C may be injected as seed light into the optical resonator of the amplifier 2 including the output coupling mirror 37 and the partial reflection mirror 36. Discharge by the pair of discharge electrodes 38 may produce a population inversion in the chamber 35 of the amplifier 2 in synchronization with such injection. At this occasion, the trigger corrector 32 may adjust a timing of the switch 33 of the PPM 34 so as to allow the amplifier 2 to efficiently amplify the third pulsed laser light beam 71C with a wavelength of about 193.4 nm from the solid-state laser system 1. As a result, a pulsed laser light beam may be amplified and oscillated by the optical resonator of the amplifier 2, and the thus-amplified pulsed laser light beam may be outputted from the output coupling mirror 37.

As described above, the third pulsed laser light beam 71C with a wavelength of about 193.4 nm outputted from the solid-state laser system 1 may be further amplified by the amplifier 2, and be outputted to the exposure apparatus 4

2.3 Issues

In the laser apparatus used for the exposure apparatus, it may be necessary to vary a wavelength of a pulsed laser light beam so as to allow for correction of variation in focal position and variation in barometric pressure by the wavelength of the pulsed laser light beam. The variation in focal position and the variation in barometric pressure may be caused by undulation of a wafer. In this case, both a function of varying a narrow wavelength range at high velocity and a function of varying a wide wavelength range at velocity at which atmospheric pressure varies may be necessary. In a case where a narrow wavelength range is varied at high velocity, for example, capability of varying a wavelength range of about 0.4 pm at less than 100 ms may be demanded. In a case where a wide wavelength range is varied at velocity at which atmospheric pressure varies, for example, capability of varying a wavelength range of about 193.3 nm to about 193.45 nm at velocity at which the atmospheric pressure varies may be demanded.

However, it may be difficult to provide the foregoing functions to a solid-state laser system that includes a combination of a nonlinear crystal and a solid-state laser as an MO and outputs a pulsed laser light beam of ultraviolet light. More specifically, in a distributed-feedback laser diode, an oscillation wavelength is controlled by a temperature of a semiconductor; therefore, it may be difficult to control the oscillation wavelength in a narrow wavelength range at high velocity and high accuracy. Moreover, when the wavelength is varied in a wide wavelength range, wavelength conversion efficiency in the nonlinear crystal may be decreased.

3. First Embodiment

Next, description is given of a laser apparatus that is used for an exposure apparatus and includes a solid-state laser system according to a first embodiment of the present disclosure. Note that substantially same components as the components of the laser apparatus that is used for the exposure apparatus and includes the solid-state laser system 1 according to the foregoing comparative example illustrated in FIG. 1 are denoted by same reference numerals, and redundant description thereof is omitted.

3.1 Configuration

Figure 2:
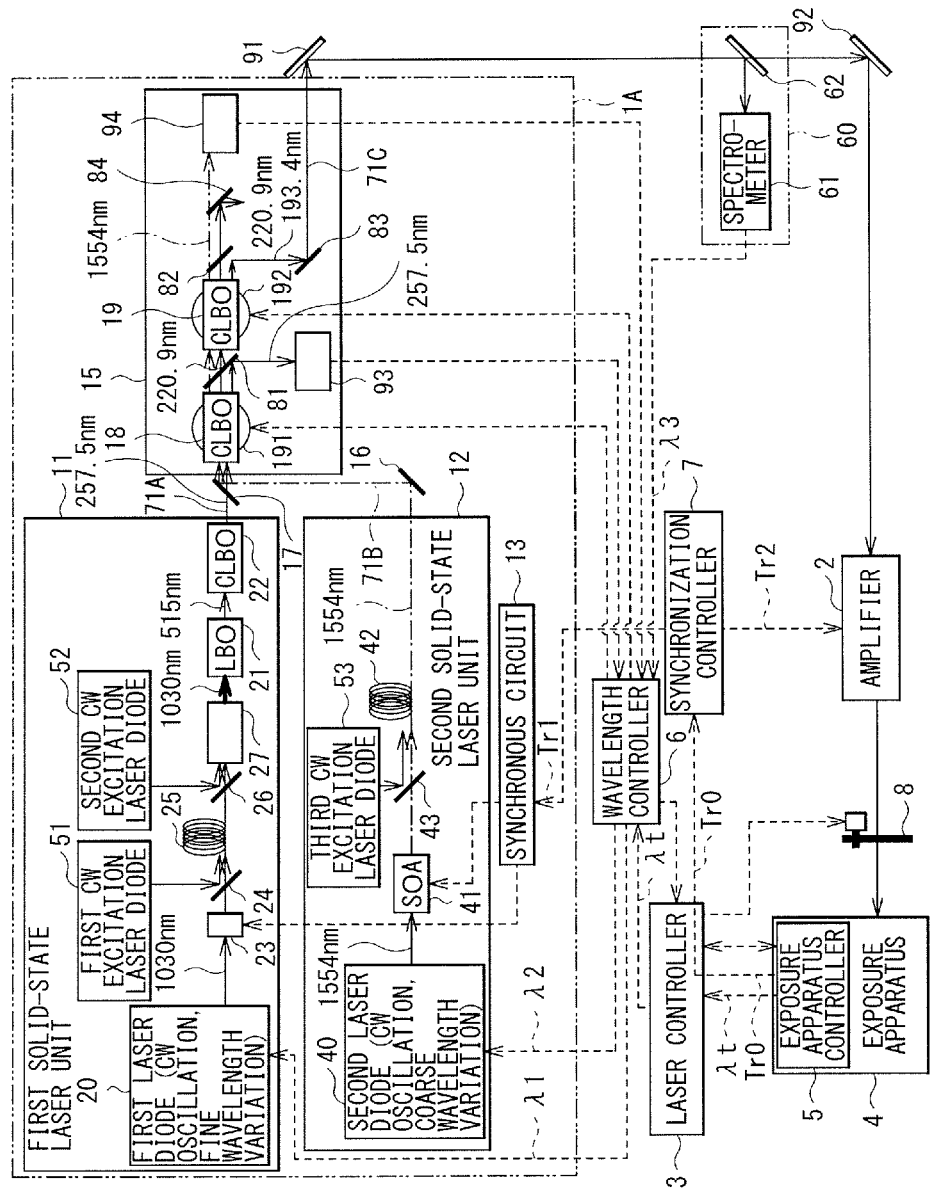
FIG. 2 schematically illustrates a configuration example of a laser apparatus that is used for an exposure apparatus and includes a solid-state laser system according to a first embodiment.

FIG. 2 schematically illustrates a configuration example of the laser apparatus that is used for the exposure apparatus and includes a solid-state laser system 1A according to the first embodiment of the present disclosure.

The laser apparatus used for the exposure apparatus according to the present embodiment may include the solid-state laser system 1A in place of the solid-state laser system 1 in the configuration of the comparative example illustrated in FIG. 1. The laser apparatus used for the exposure apparatus according to the present embodiment may further include an exit port shutter 8 disposed in an optical path between the amplifier 2 and the exposure apparatus 4.

In the solid-state laser system 1A, the first solid-state laser unit 11 may include a first laser diode 20 in place of the first laser diode 200. The first laser diode 20 may be an external cavity laser diode that varies a fine wavelength, e.g., a narrow wavelength range of about 0.4 pm at high velocity.

In the solid-state laser system 1A, the second solid-state laser unit 12 may include a second laser diode 40 in place of the second laser diode 400. The second laser diode 40 may be a distributed-feedback laser diode that varies a coarse wavelength, e.g., a wide wavelength range of about 193.3 nm to about 193.45 nm at velocity at which atmospheric pressure varies.

Thus, in the solid-state laser system 1A, a variation range of the first wavelength of the first pulsed laser light beam 71A outputted from the first solid-state laser unit 11 may be narrower than a variation range of the second wavelength of the second pulsed laser light beam 71B outputted from the second solid-state laser unit 12. Moreover, a variation velocity of the first wavelength of the first pulsed laser light beam 71A outputted from the first solid-state laser unit 11 may be higher than a variation velocity of the second wavelength of the second pulsed laser light beam 71B outputted from the second solid-state laser unit 12.

In the solid-state laser system 1A, the wavelength conversion system 15 may further include a dichroic mirror 84, a first photodetector 93, a second photodetector 94, and first and second rotation stages 191 and 192.

The first rotation stage 191 may be a rotation mechanism that varies an entry angle θ1 of light entering the CLBO crystal 18. The second rotation stage 192 may be a rotation mechanism that varies an entry angle θ2 of light entering the CLBO crystal 19. A rotation angle of each of the first and second rotation stages 191 and 192 may be controlled by the wavelength controller 6.

The first photodetector 93 may be disposed in an optical path of a pulsed laser light beam with a wavelength different from a wavelength of about 220.9 nm of a pulsed laser light beam that is converted light from the CLBO crystal 18. The first photodetector 93 may be disposed, for example, in an optical path of a pulsed laser light beam with a wavelength of about 257.5 nm reflected by the dichroic mirror 81, and may detect light intensity of the pulsed laser light beam with a wavelength of about 257.5 nm. A signal indicating a detection value derived from the first photodetector 93 may be outputted to the wavelength controller 6. The rotation angle of the first rotation stage 191 may be controlled by the wavelength controller 6 so as to change the detection value derived from the first photodetector 93 smaller.

The dichroic mirror 84 may be disposed in an optical path of pulsed laser light beams with wavelengths of about 1554 nm and about 220.9 nm having passed through the dichroic mirror 82. The dichroic mirror 84 may be so disposed as to allow the pulsed laser light beam with a wavelength of about 1554 nm to pass therethrough at high transmittance and as to reflect the pulsed laser light beam with a wavelength of about 220.9 nm at high reflectivity.

The second photodetector 94 may be disposed in an optical path of a pulsed laser light beam with a wavelength different from a wavelength of about 193.4 nm of the third pulsed laser light beam 71C that is converted light from the CLBO crystal 19. The second photodetector 94 may be disposed, for example, in an optical path of the pulsed laser light beam with a wavelength of about 1554 nm having passed through the dichroic mirrors 82 and 84, and may detect light intensity of the pulsed laser light beam with a wavelength of about 1554 nm. A signal indicating the detection value derived from the second photodetector 94 may be outputted to the wavelength controller 6. The rotation angle of the second rotation stage 192 may be controlled by the wavelength controller 6 so as to change the detection value derived from the second photodetector 94 smaller.

Other configurations may be substantially similar to those of the laser apparatus used for the exposure apparatus illustrated in FIG. 1.

3.2 Operation

The wavelength controller 6 may receive a signal indicating the value of the target wavelength $\lambda t$ from the exposure apparatus controller 5 via the laser controller 3. The wavelength controller 6 may transmit data of an initial setting wavelength $\lambda 10$ as the setting wavelength $\lambda 1$ to the first laser diode 20 so as to cause the third wavelength $\lambda 3$ of the third pulsed laser light beam 71C, which is to be outputted from the wavelength conversion system 15, to be an initial wavelength of about 193.4 nm. The wavelength controller 6 may also transmit data of an initial setting wavelength $\lambda 20$ as the setting wavelength $\lambda 2$ to the second laser diode 40 so as to cause the third wavelength $\lambda 3$ of the third pulsed laser light beam 71C, which is to be outputted from the wavelength conversion system 15, to be the initial wavelength of about 193.4 nm. Thereafter, the wavelength controller 6 may cause the first laser diode 20 and the second laser diode 40 to oscillate in the CW mode.

As a result, the first solid-state laser unit 11 may output the first pulsed laser light beam 71A with a wavelength of about 257.5 nm. Moreover, the second solid-state laser unit 12 may output the second pulsed laser light beam 71B with a wavelength of about 1554 nm.

The first pulsed laser light beam 71A and the second pulsed laser light beam 71B may enter the wavelength conversion system 15. The wavelength conversion system 15 may output the third pulsed laser light beam 71C with a wavelength of about 193.4 nm that is the third wavelength $\lambda 3$ converted from a wavelength of about 257.5 nm and a wavelength of about 1554 nm. The wavelength monitor 60 may detect the value of the third wavelength $\lambda 3$ of the third pulsed laser light beam 71C outputted from the wavelength conversion system 15.

The wavelength controller 6 may control the first solid-state laser unit 11 to vary the first wavelength of the first pulsed laser light beam 71A on a condition that the absolute value of the difference $\delta\lambda$ ($=\lambda 3-\lambda t$) between the value of the target wavelength $\lambda t$ and the value of the third wavelength $\lambda 3$ detected by the wavelength monitor 60 is equal to or less than a predetermined value $\delta\lambda 1$. More specifically, the setting wavelength $\lambda 1$ of the first laser diode 20 in the first solid-state laser unit 11 may be controlled to control an oscillation wavelength of the first laser diode 20, thereby varying the first wavelength of the first pulsed laser light beam 71A. Moreover, the predetermined value δλ1 may be about 0.4 pm, for example. Thus, the third wavelength λ3 of the third pulsed laser light beam 71C to be outputted from the wavelength conversion system 15 may approach the target wavelength λt at high velocity.

In contrast, the wavelength controller 6 may control the second solid-state laser unit 12 to vary the second wavelength of the second pulsed laser light beam 71B on a condition that the absolute value of the difference &S between the value of the target wavelength λt and the value of the third wavelength λ3 detected by the wavelength monitor 60 exceeds the predetermined value δλ1. More specifically, the setting wavelength λ2 of the second laser diode 40 in the second solid-state laser unit 12 may be controlled to control an oscillation wavelength of the second laser diode 40, thereby varying the second wavelength of the second pulsed laser light beam 71B.

Moreover, the wavelength controller 6 may control the rotation angle of the first rotation stage 191 so as to change the detection value derived from the first photodetector 93 smaller and closer to a minimal value, thereby controlling the entry angle θ1 of the light entering the CLBO crystal 18. Thus, wavelength conversion efficiency in the CLBO crystal 18 may be maximized.

Subsequently, the wavelength controller 6 may control the rotation angle of the second rotation stage 192 so as to change the detection value derived from the second photodetector 94 smaller and closer to a minimal value, thereby controlling the entry angle θ2 of the light entering the CLBO crystal 19. Thus, wavelength conversion efficiency in the CLBO crystal 19 may be maximized.

Accordingly, the third wavelength λ3 of the third pulsed laser light beam 71C to be outputted from the wavelength conversion system 15 may approach the target wavelength λt, and a decrease in wavelength conversion efficiency in each of the CLBO crystals 18 and 19 that are non-linear crystals may be suppressed.

Moreover, a process of wavelength optimization on the basis of a result of detection of the third wavelength λ3 derived from the wavelength monitor 60 and a process of optimization of the entry angle of light entering the nonlinear crystal on the basis of a result of detection derived from each of the first and second photodetectors 93 and 94 mentioned above may be each repeated a plurality of times.

Next, description is given of a more specific example of a control operation by the wavelength controller 6 with reference to FIGS. 3 to 7.

Figure 3:
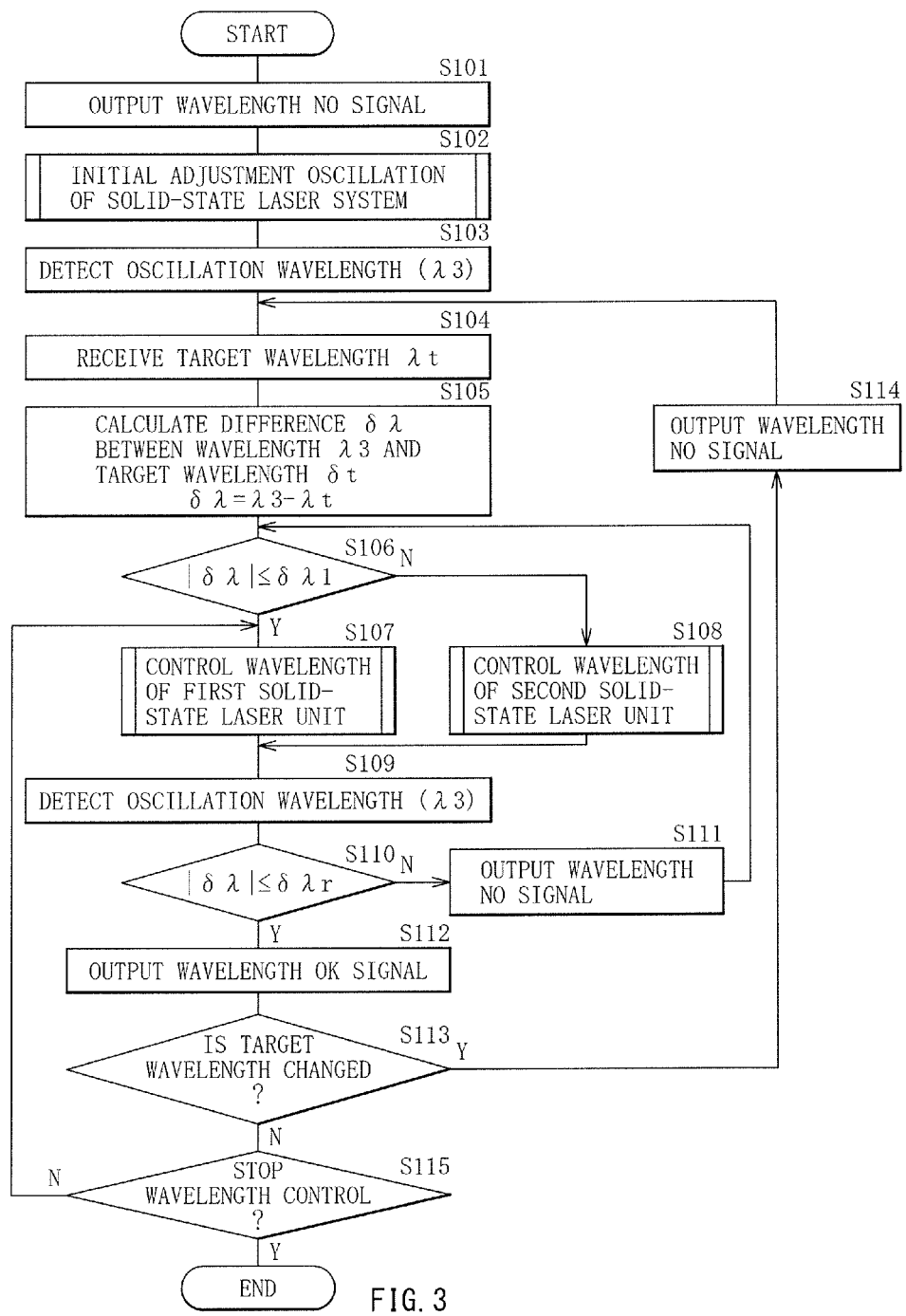
FIG. 3 is a main flow chart illustrating an example of a flow of control by a wavelength controller in the laser apparatus used for the exposure apparatus illustrated in FIG. 2.

FIG. 3 is a main flow chart illustrating an example of a flow of control by the wavelength controller 6 in the present embodiment.

The wavelength controller 6 may first output a wavelength No signal to the exposure apparatus controller 5 via the laser controller 3 (step S101) to close the exit port shutter 8. Subsequently, the wavelength controller 6 may cause the solid-state laser system 1A to perform initial adjustment oscillation for initial setting of the solid-state laser system 1A (step S102).

Next, the wavelength controller 6 may detect the oscillation wavelength of the solid-state laser system 1A, i.e., the third wavelength λ3 of the third pulsed laser light beam 71C outputted from the wavelength conversion system 15 with use of the wavelength monitor 60 (step S103).

Subsequently, the wavelength controller 6 may receive the signal indicating the value of the target wavelength λt from the exposure apparatus controller 5 via the laser controller 3 (step S104). Thereafter, the wavelength controller 6 may calculate the difference δλ between the value of the target wavelength λt and the value of the third wavelength λ3 detected by the wavelength monitor 60 by the following expression (step S105).

$$\delta\lambda = \lambda 3 - \lambda t$$

Subsequently, the wavelength controller 6 may determine whether or not a condition of |δλ|≤δλ1 is satisfied, i.e., whether or not the absolute value of the difference δλ is equal to or less than the predetermined value δλ1 (step S106).

In a case where the wavelength controller 6 determines that the condition of |δλ|δλ| is satisfied, i.e., the absolute value of the difference δλ is equal to or less than the predetermined value δλ1 (step S106; Y), the wavelength controller 6 may then perform a process of controlling the wavelength of the first solid-state laser unit 11 (step S107).

In contrast, in a case where the wavelength controller 6 determines that the condition of |δλ|≤δλ1 is not satisfied, i.e., the absolute value of the difference δλ exceeds the predetermined value δλ1 (step S106; N), the wavelength controller 6 may then perform a process of controlling the wavelength of the second solid-state laser unit 12 (step S108).

Subsequently, the wavelength controller 6 may detect the oscillation wavelength of the solid-state laser system 1A, i.e., the third wavelength λ3 of the third pulsed laser light beam 71C outputted from the wavelength conversion system 15 with use of the wavelength monitor 60 (step S109).

Thereafter, the wavelength controller 6 may determine whether or not a condition of |δλ|≤δλr is satisfied, i.e., whether or not the absolute value of the difference δλ is equal to or less than a predetermined acceptable value δλr (step S110). In a case where the wavelength controller 6 determines that the condition of |δλ|≤δλr is not satisfied (step S110; N), the wavelength controller 6 may output the wavelength No signal to the exposure apparatus controller 5 via the laser controller 3 (step S111) to keep the exit port shutter 8 closed. Thereafter, the wavelength controller 6 may return to the process in the step S106.

In contrast, in a case where the wavelength controller 6 determines that |δλ|≤δλr is satisfied (step 110; Y), the wavelength controller 6 may then output a wavelength OK signal to the exposure apparatus controller 5 via the laser controller 3 (step S112) to open the exit port shutter 8. Subsequently, the wavelength controller 6 may determine whether the target wavelength λt is changed (step S113). In a case where the wavelength controller 6 determines that the target wavelength λt is changed (step S113; Y), the wavelength controller 6 may then output the wavelength No signal (step S114) to close the exit port shutter 8. Thereafter, the wavelength controller 6 may return to the process in the step S104.

In a case where the wavelength controller 6 determines that the target wavelength λt is not changed (step S113; N), the wavelength controller 6 may then determine whether to stop wavelength control (step S115). In a case where the wavelength controller 6 determines not to stop the wavelength control (step S115; N), the wavelength controller 6 may return to the process in the step S107. In a case where the wavelength controller 6 determines to stop the wavelength control (step S115; Y), the wavelength controller 6 may end the main process.

Figure 4:
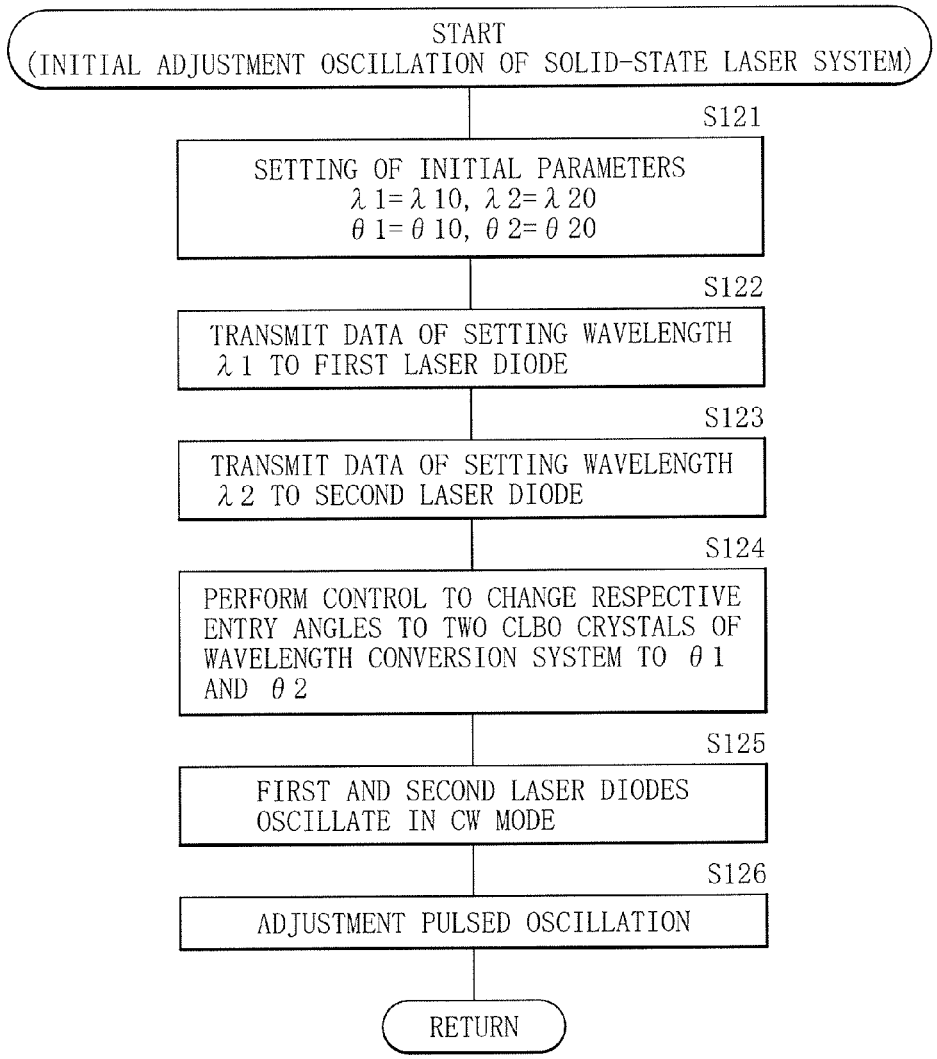
FIG. 4 is a sub-flow chart illustrating details of a process in step S102 in the main flow chart illustrated in FIG. 3.

FIG. 4 is a sub-flow chart illustrating details of the process in the step S102 in the main flow chart illustrated in FIG. 3.

The wavelength controller 6 may perform a process illustrated in FIG. 4 as the initial adjustment oscillation of the solid-state laser system 1A.

First, the wavelength controller 6 may set initial parameters (step S121).

Setting of the initial parameters may include setting of the setting wavelengths λ1 and λ2 and the entry angles θ1 and θ2 as in the following expressions.

$$\lambda 1=\lambda 10 \text{ and } \lambda 2=\lambda 20$$

$$\theta 1=\theta 10 \text{ and } \theta 2=\theta 20$$

In other words, the wavelength controller 6 may set the setting wavelength λ1 of the first laser diode 20 to the initial setting wavelength λ10 and may set the setting wavelength λ2 of the second laser diode 40 to the initial setting wavelength λ20. Moreover, the entry angle θ1 of light entering the CLBO crystal 18 may be set to θ10, and the entry angle θ2 of light entering the CLBO crystal 19 may be set to θ20.

Subsequently, the wavelength controller 6 may transmit data of the setting wavelength λ1 to the first laser diode 20 (step S122). Thereafter, the wavelength controller 6 may transmit data of the setting wavelength λ2 to the second laser diode 40 (step S123).

Subsequently, the wavelength controller 6 may control the rotation angles of the first and second rotation stages 191 and 192, thereby performing control to change the entry angle of the light entering the CLBO crystal 18 of the wavelength conversion system 15 and the entry angle of the light entering CLBO crystal 19 of the wavelength conversion system 15 to θ1 and θ2, respectively (step S124).

Thereafter, the wavelength controller 6 may cause the first and second laser diodes 20 and 40 via the laser controller 3 to oscillate in the CW mode (step S125). Accordingly, the first laser diode 20 may output a CW laser light beam with the setting wavelength λ1 as the first seed light. Moreover, the second laser diode 40 may output a CW laser light beam with the setting wavelength λ2 as the second seed light.

Subsequently, the wavelength controller 6 may cause the synchronization controller 7 to output the first and second trigger signals Tr1 and Tr2 at a predetermined repetition frequency to perform initial adjustment pulsed oscillation (step S126). Thereafter, the wavelength controller 6 may return to the main flow in FIG. 3.

Figure 5:
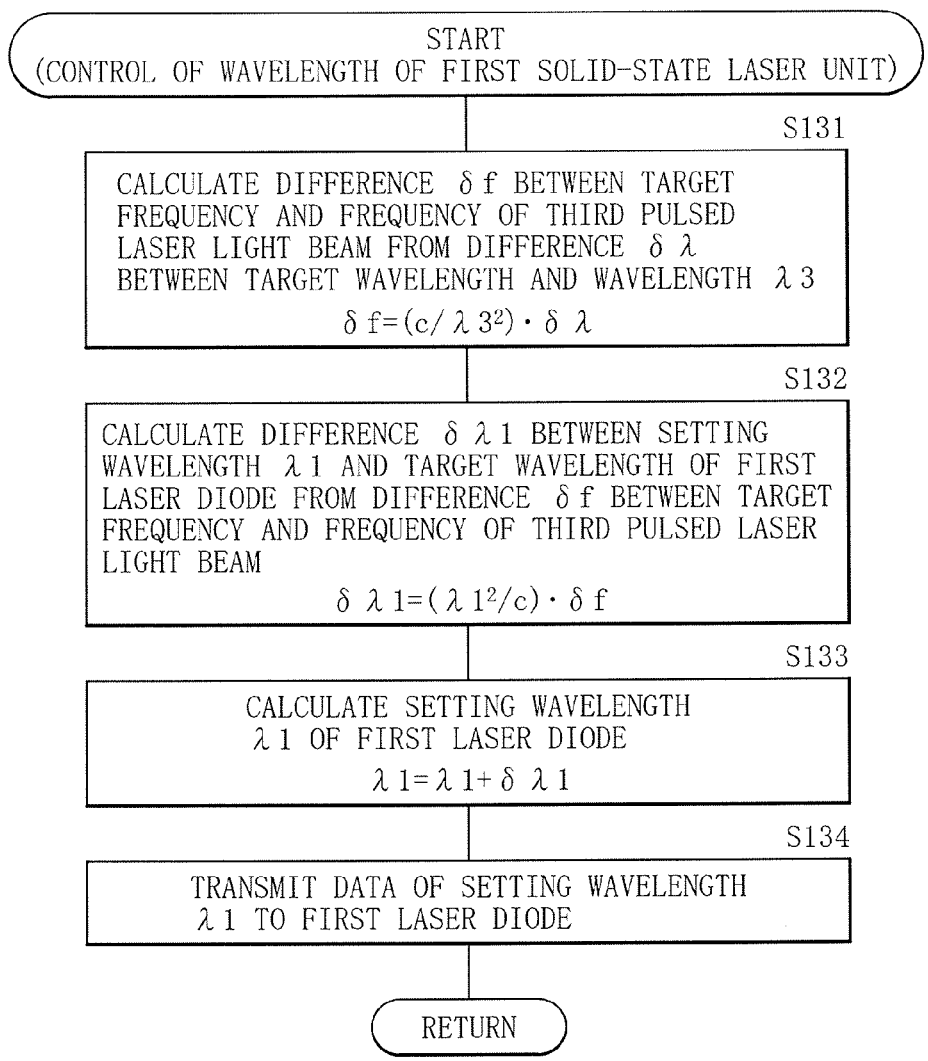
FIG. 5 is a sub-flow chart illustrating details of a process in step S107 in the main flow chart illustrated in FIG. 3.

FIG. 5 is a sub-flow chart illustrating details of the process in the step S107 in the main flow chart illustrated in FIG. 3. The wavelength controller 6 may perform a process illustrated in FIG. 5 as a process of controlling the wavelength of the first solid-state laser unit 11.

The wavelength controller 6 may calculate a difference δf between a target frequency f and a frequency of the third pulsed laser light beam 71C by the following expression from the difference δλ between the value of the target wavelength λt and the value of the third wavelength λ3 detected by the wavelength monitor 60 (step S131).

$$\delta f=(c/\lambda 3^2)\cdot\delta\lambda$$

where c may be velocity of light.

Subsequently, the wavelength controller 6 may calculate a difference δλ1 between the setting wavelength λ1 and the target wavelength of the first laser diode 20 by the following expression from the difference δf between the target frequency f and the value of the third pulsed laser light beam 71C (step S132).

$$\delta\lambda 1=(\lambda 1^2/c)\cdot\delta f$$

Thereafter, the wavelength controller 6 may calculate the setting wavelength λ1 of the first laser diode 20 by the following expression (step S133).

$$\lambda 1=\lambda 1+\delta\lambda 1$$

Subsequently, the wavelength controller 6 may transmit data of the setting wavelength λ1 to the first laser diode 20 (step S134), and may return to the main flow in FIG. 3.

Figure 6:
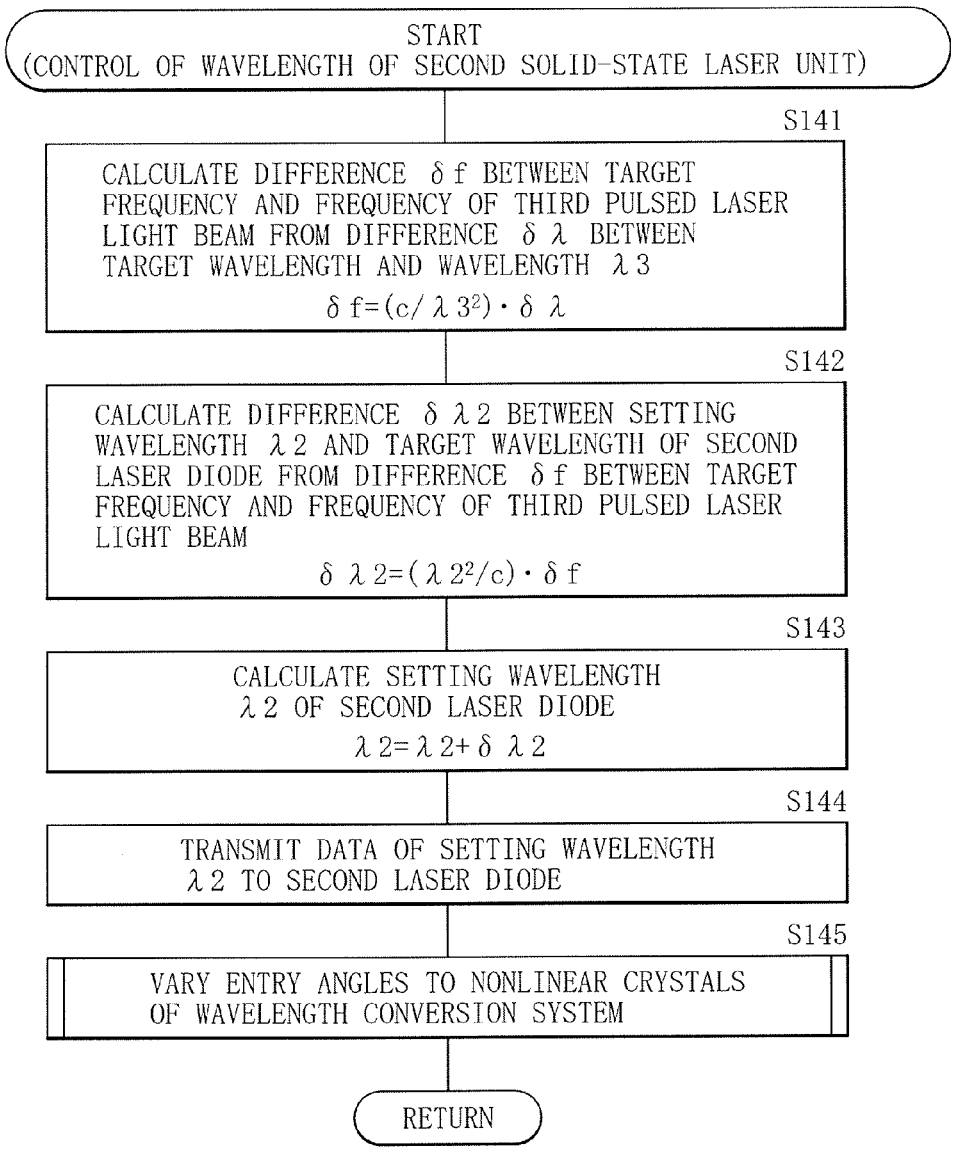
FIG. 6 is a sub-flow chart illustrating details of a process in step S108 in the main flow chart illustrated in FIG. 3.

FIG. 6 is a sub-flow chart illustrating details of the process in the step S108 in the main flow chart illustrated in FIG. 3. The wavelength controller 6 may perform a process illustrated in FIG. 6 as a process of controlling the wavelength of the second solid-state laser unit 12.

The wavelength controller 6 may calculate the difference δf between the target frequency f and the frequency of the third pulsed laser light beam 71C by the following expression from the difference δλ between the value of the target wavelength λt and the value of the third wavelength λ3 detected by the wavelength monitor 60 (step S141).

$$\delta f=(c/\lambda 3^2)\cdot\delta\lambda$$

where c may be velocity of light.

Subsequently, the wavelength controller 6 may calculate a difference δλ2 between the setting wavelength λ2 and the target wavelength of the second laser diode 40 by the following expression from the difference δf between the target frequency f and the value of the third wavelength λ3 (step S142).

$$\delta\lambda 2=(\lambda 2^2/c)\cdot\delta f$$

Thereafter, the wavelength controller 6 may calculate the setting wavelength λ2 of the second laser diode 40 by the following expression (step S143).

$$\lambda 2=\lambda 2+\delta\lambda 2$$

Subsequently, the wavelength controller 6 may transmit data of the setting wavelength λ2 to the second laser diode 40 (step S144). Thereafter, in order to suppress a decrease in wavelength conversion efficiency of the wavelength conversion system 15, the wavelength controller 6 may perform a process of varying the entry angles θ1 and θ2 to two CLBO crystals 18 and 19, respectively, that are nonlinear crystals (step S145). Thereafter, the wavelength controller 6 may return to the main flow in FIG. 3.

Figure 7:
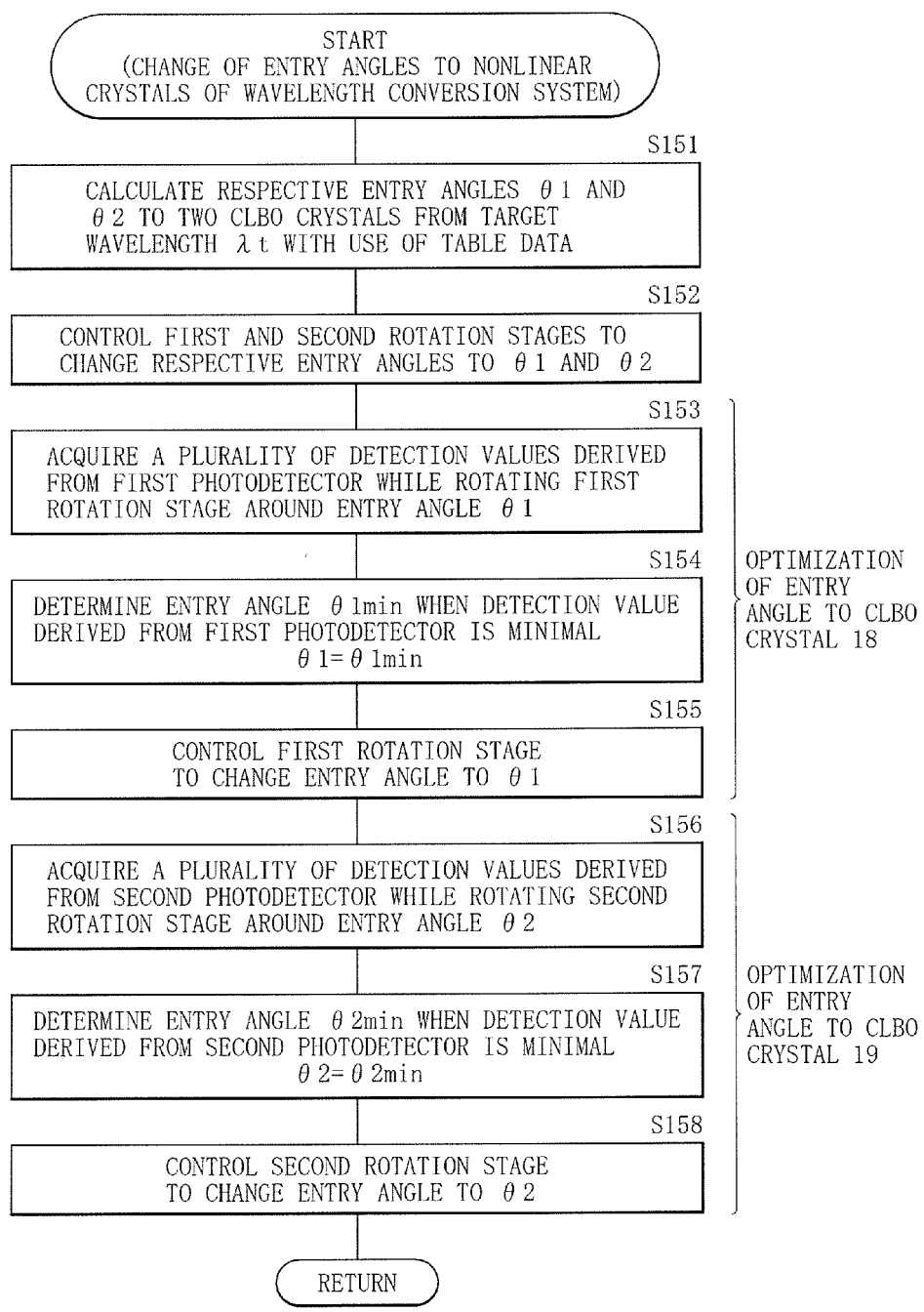
FIG. 7 is a sub-flow chart illustrating details of a process in step S145 in the flow chart illustrated in FIG. 6.

FIG. 7 is a sub-flow chart illustrating details of the process in the step S145 in the flow chart illustrated in FIG. 6.

The wavelength controller 6 may calculate the entry angle θ1 of the light entering the CLBO crystal 18 and the entry angle θ2 of the light entering the CLBO crystal 19 from the target wavelength λt with use of table data (step S151). The wavelength controller 6 may store a relationship between the target wavelength λt and both the entry angle θ1 of the light entering the CLBO crystal 18 and the entry angle θ2 of the light entering the CLBO crystal 19 as table data in an unillustrated storage section in advance.

Subsequently, the wavelength controller 6 may control the first and second rotation stages 191 and 192 to change the entry angles to CLBO crystals 18 and 19 to θ1 and θ2, respectively (step S152).

Thereafter, the wavelength controller 6 may acquire a plurality of detection values derived from the first photodetector 93 while rotating the first rotation stage 191 around the entry angle θ1 (step S153). The wavelength controller 6 may then determine an entry angle θ1min when the detection value derived from the first photodetector 93 is minimal by the following expression (step S154).

$$\theta 1=\theta 1 min$$

Subsequently, the wavelength controller 6 may control the first rotation stage 191 to change the entry angle to the CLBO crystal 18 to θ1 (step S155).

The wavelength controller 6 may optimize the entry angle θ1 of the light entering the CLBO crystal 18 by the processes in the steps S153 to S155 mentioned above.

Subsequently, the wavelength controller 6 may acquire a plurality of detection values derived from the second photodetector 94 while rotating the second rotation stage 192 around the entry angle θ2 (step S156). Thereafter, the wavelength controller 6 may determine an entry angle θ2*min* when the detection value derived from the second photodetector 94 is minimal by the following expression (step S157).

θ2=θ2min

Subsequently, the wavelength controller 6 may control the second rotation stage 192 to change the entry angle to the CLBO crystal 19 to θ2 (step S158), and may return to the main flow in FIG. 3.

The wavelength controller 6 may optimize the entry angle θ2 of the light entering the CLBO crystal 19 by the processes in the steps S156 to S158 mentioned above.

3.3 Workings

According to the laser apparatus used for the exposure apparatus of the present embodiment, in a case where the absolute value of the difference δλ between the value of the target wavelength λt and the value of the third wavelength λ3 detected by the wavelength monitor 60 is equal to or less than the predetermined value δλ1, the setting wavelength λ1 of the first laser diode 20 may be controlled. In a case where the absolute value of the difference δλ exceeds the predetermined value δλ1, the setting wavelength λ2 of the second laser diode 40 may be controlled. This makes it possible for the third wavelength λ3 of the third pulsed laser light beam 71C to approach the target wavelength λt.

Moreover, in the case where the absolute value of the difference δλ is equal to or less than the predetermined value δλ1, the third wavelength λ3 may approach the target wavelength λt at high velocity, and even if the absolute value of the difference δλ exceeds the predetermined value δλ1, the third pulsed laser light beam 71C may be outputted with high conversion efficiency.

3.4 Modification Examples

3.4.1 First Modification Example

In the configuration example in FIG. 2, the first photodetector 93 detects light intensity of the pulsed laser light beam with a wavelength of about 257.5 nm and controls the first rotation stage 191 so as to decrease the light intensity; however, the present embodiment is not limited thereto. For example, the first photodetector 93 may detect light intensity of a pulsed laser light beam with a wavelength of about 1554 nm and may control the first rotation stage 191 to decrease the light intensity. Moreover, the first photodetector 93 may detect light intensity of a pulsed laser light beam with a wavelength of about 220.9 nm that is converted light from the CLBO crystal 18 and may control the first rotation stage 191 to change the light intensity larger to a maximal value.

Likewise, in the configuration example in FIG. 2, the second photodetector 94 detects light intensity of the pulsed laser light beam with a wavelength of about 1554 nm and controls the second rotation stage 192 to degrease the light intensity; however, the present embodiment is not limited thereto. For example, the second photodetector 94 may detect light intensity of a pulsed laser light beam with a wavelength of about 220.9 nm and may control the second rotation stage 192 to degrease the light intensity.

Figure 8:
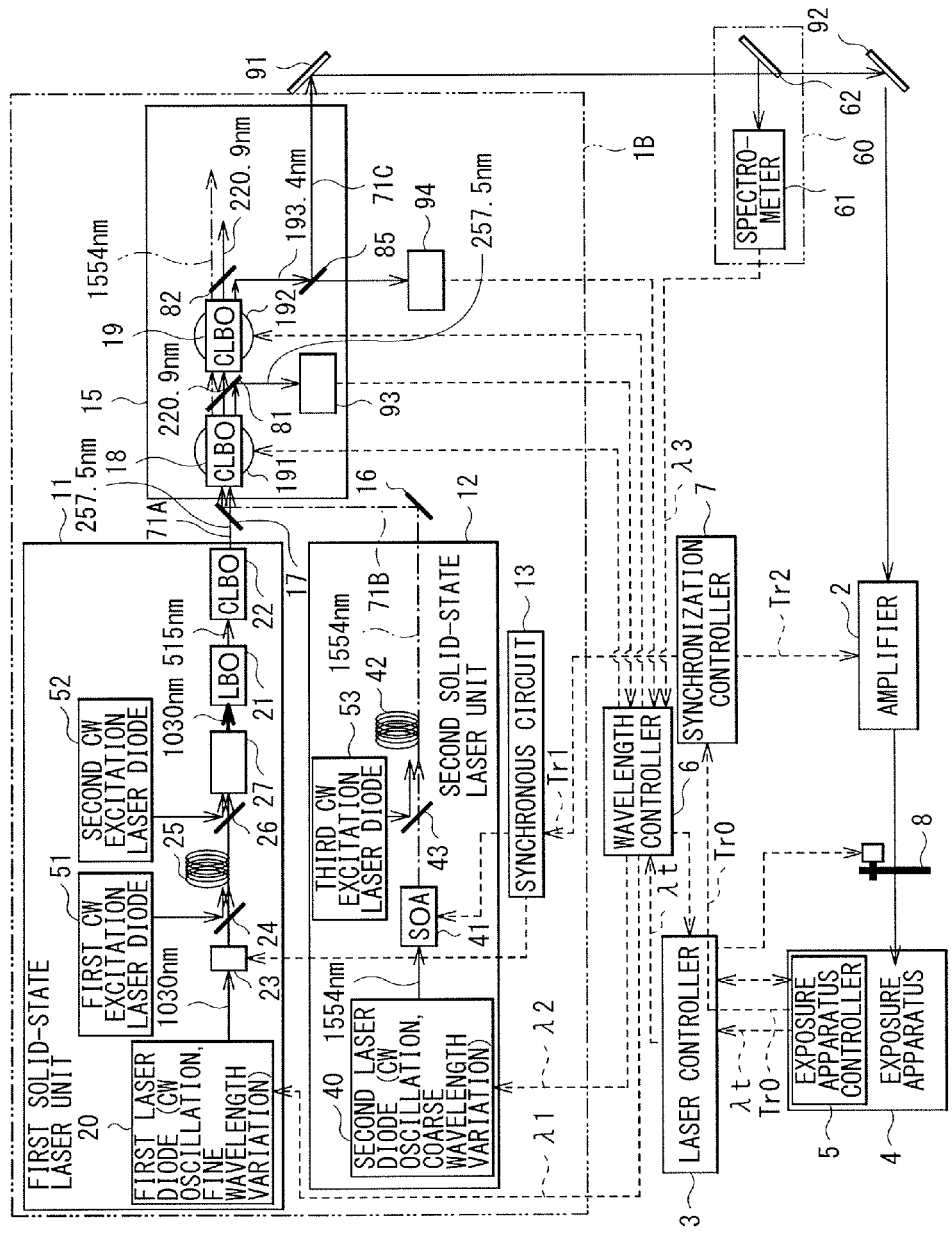
FIG. 8 schematically illustrates a configuration example of a laser apparatus used for an exposure apparatus according to a first modification example of the first embodiment.
Figure 9:
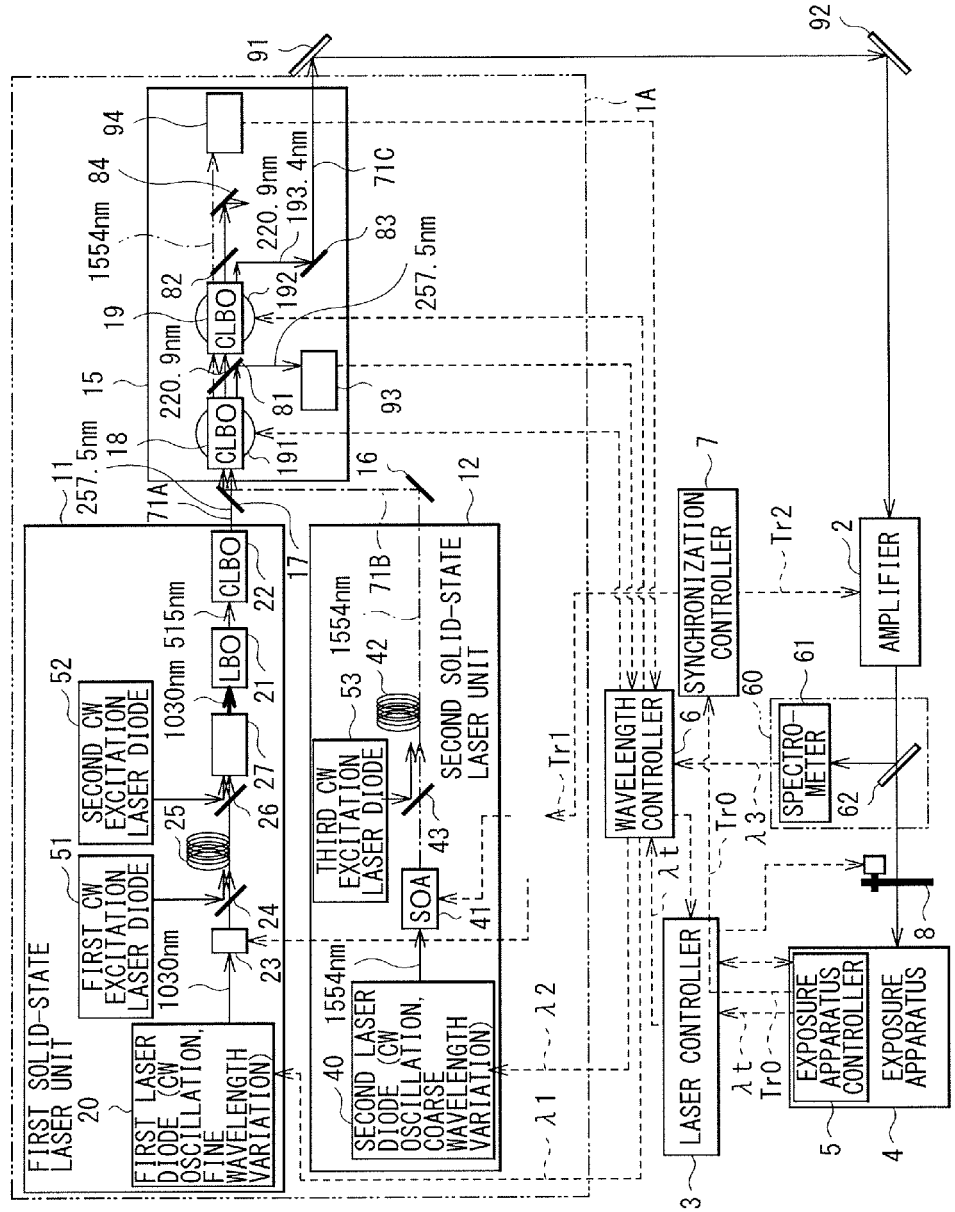
FIG. 9 schematically illustrates a configuration example of a laser apparatus used for an exposure apparatus according to a second modification example of the first embodiment.

Moreover, as illustrated in a first modification example in FIG. 8, for example, the second photodetector 94 may detect light intensity of a pulsed laser light beam with a wavelength of about 193.4 nm that is converted light from the CLBO crystal 19 and may control the second rotation stage 192 to change the light intensity larger to a maximal value. As illustrated in a solid-state laser system 1B in FIG. 8, for example, the configuration example in FIG. 2 may include a beam splitter 85 in place of the high reflection mirror 83 in the wavelength conversion system 15. The beam splitter 85 may allow a part of the pulsed laser light beam with a wavelength of about 193.4 nm to pass therethrough. Moreover, the second photodetector 94 may be disposed in an optical path of the pulsed laser light beam with a wavelength of about 193.4 nm having passed through the beam splitter 85 to detect the light intensity of the pulsed laser light beam.

3.4.2 Second Modification Example

In the configuration example in FIG. 2, the wavelength monitor 60 is disposed in an optical path between the wavelength conversion system 15 and the amplifier 2; however, the present embodiment is not limited thereto. As illustrated in a second modification example in FIG. 9, for example, the wavelength monitor 60 may be disposed in an optical path of the third pulsed laser light beam 71C amplified by the amplifier 2. For example, the wavelength monitor 60 may be disposed in an optical path between the amplifier 2 and the exit port shutter 8.

4. Second Embodiment

Next, description is given of a laser apparatus that is used for an exposure apparatus and includes a solid-state laser system according to a second embodiment of the present disclosure. Note that substantially same components as the components of the laser apparatus used for the exposure apparatus according to the foregoing comparative example or the foregoing first embodiment are denoted by same reference numerals, and redundant description thereof is omitted.

4.1 Configuration

Figure 10:
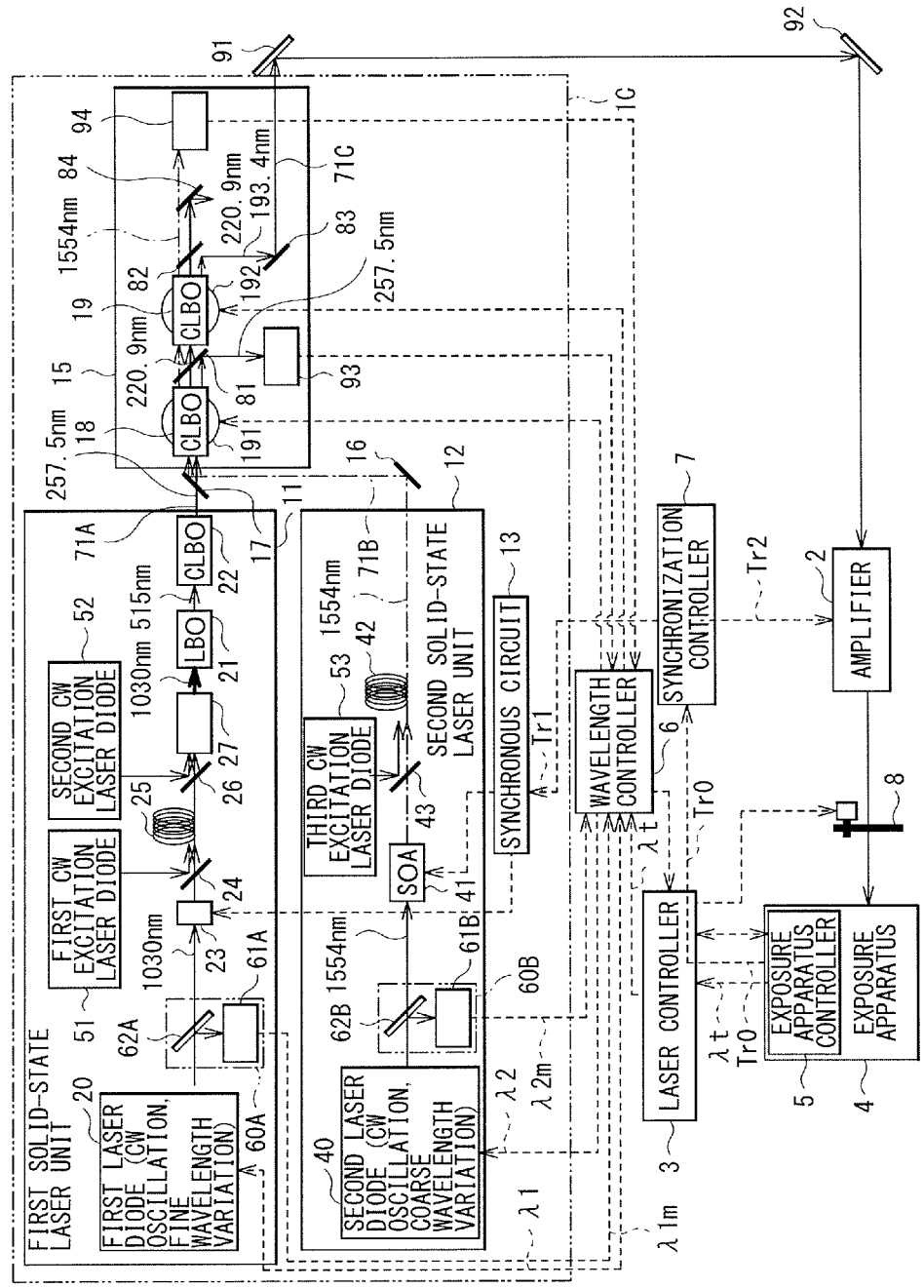
FIG. 10 schematically illustrates a configuration example of a laser apparatus used for an exposure apparatus according to a second embodiment.

FIG. 10 schematically illustrates a configuration example of the laser apparatus that is used for the exposure apparatus and includes a solid-state laser system 1C according to the second embodiment of the present disclosure.

The laser apparatus used for the exposure apparatus according to the present embodiment may include the solid-state laser system 1C in place of the solid-state laser system 1A in the first embodiment illustrated in FIG. 2. The laser apparatus used for the exposure apparatus according to the present embodiment may include a first wavelength monitor 60A and a second wavelength monitor 60B in the solid-state laser system 1C in place of the wavelength monitor 60.

The first wavelength monitor 60A may be provided in an optical path of the first seed light to be outputted from the first laser diode 20 in the first solid-state laser unit 11. The first wavelength monitor 60A may include a first spectrometer 61A and a beam splitter 62A. The beam splitter 62A may be so disposed as to reflect a part of the first seed light, thereby allowing the thus-reflected light to enter the first spectrometer 61A. The first spectrometer 61A may be an etalon spectrometer that measures the wavelength of the first seed light. The first spectrometer 61A may output, to the wavelength controller 6, data of a measured wavelength $\lambda 1m$ that is a value measured by the first wavelength monitor 60A.

The second wavelength monitor 60B may be provided in an optical path of the second seed light to be outputted from the second laser diode 40 in the second solid-state laser unit 12. The second wavelength monitor 60B may include a second spectrometer 61B and a beam splitter 62B. The beam splitter 62B may be so disposed as to reflect a part of the second seed light, thereby allowing the thus-reflected light to enter the second spectrometer 61B. The second spectrometer 61B may be an etalon spectrometer that measures the wavelength of the second seed light. The second spectrometer 61B may output, to the wavelength controller 6, data of a measured wavelength $\lambda 2m$ that is a value measured by the second wavelength monitor 60B.

The wavelength controller 6 may have a function as a calculation section that calculates the value of the third wavelength $\lambda 3$ of the third pulsed laser light beam 71C from the data of the measured wavelength $\lambda 1m$ derived from the first wavelength monitor 60A and the data of the measured wavelength $\lambda 2m$ derived from the second wavelength monitor 60B. In other words, in the present embodiment, the first wavelength monitor 60A, the second wavelength monitor 60B, and the wavelength controller 6 may configure a wavelength detector that detects the third wavelength $\lambda 3$.

Other configurations may be substantially similar to those of the laser apparatus used for the exposure apparatus illustrated in FIG. 2.

4.2 Operation

The wavelength controller 6 may receive a signal indicating the value of the target wavelength $\lambda t$ from the exposure apparatus controller 5 via the laser controller 3. The wavelength controller 6 may transmit the data of the initial setting wavelength $\lambda 10$ as the setting wavelength $\lambda 1$ to the first laser diode 20 so as to cause the third wavelength $\lambda 3$ of the third pulsed laser light beam 71C, which is to be outputted from the wavelength conversion system 15, to be an initial wavelength of about 193.4 nm. The wavelength controller 6 may also transmit the data of the initial setting wavelength $\lambda 20$ as the setting wavelength $\lambda 2$ of the second laser diode 40 so as to cause the third wavelength $\lambda 3$ of the third pulsed laser light beam 71C, which is to be outputted from the wavelength conversion system 15, to be an initial wavelength of about 193.4 nm. Thereafter, the wavelength controller 6 may cause the first laser diode 20 and the second laser diode 40 to oscillate in the CW mode.

As a result, the first solid-state laser unit 11 may output the first pulsed laser light beam 71A with a wavelength of about 257.5 nm. Moreover, the second solid-state laser unit 12 may output the second pulsed laser light beam 71B with a wavelength of about 1554 nm.

The first pulsed laser light beam 71A and the second pulsed laser light beam 71B may enter the wavelength conversion system 15. The wavelength conversion system 15 may output the third pulsed laser light beam 71C with a wavelength of about 193.4 nm that is the third wavelength $\lambda 3$ converted from a wavelength of about 257.5 nm and a wavelength of about 1554 nm.

The first wavelength monitor 60A may measure an oscillation wavelength of the first seed light from the first laser diode 20. The wavelength controller 6 may receive data of the measured wavelength $\lambda 1m$ measured by the first wavelength monitor 60A.

The second wavelength monitor 60B may measure an oscillation wavelength of the second seed light from the second laser diode 40. The wavelength controller 6 may receive data of the measured wavelength $\lambda 2m$ measured by the second wavelength monitor 60B.

The wavelength controller 6 may calculate and detect the value of the third wavelength $\lambda 3$ of the third pulsed laser light beam 71C from the data of the measured wavelength $\lambda 1m$ derived from the first wavelength monitor 60A and the data of the measured wavelength $\lambda 2m$ derived from the second wavelength monitor 60B.

The wavelength controller 6 may control the first solid-state laser unit 11 to vary the first wavelength of the first pulsed laser light beam 71A on a condition that the absolute value of the difference $\delta\lambda$ ($=\lambda 3-\lambda t$) between the value of the target wavelength $\lambda t$ and the value of the third wavelength $\lambda 3$ detected by calculation is equal to or less than the predetermined value $\delta\lambda 1$. More specifically, the setting wavelength $\lambda 1$ of the first laser diode 20 in the first solid-state laser unit 11 may be controlled to control the oscillation wavelength of the first laser diode 20, thereby varying the first wavelength of the first pulsed laser light beam 71A. Moreover, the predetermined value $\delta\lambda 1$ may be about 0.4 pm, for example. Thus, the third wavelength $\lambda 3$ of the third pulsed laser light beam 71C to be outputted from the wavelength conversion system 15 may approach the target wavelength $\lambda t$ at high velocity.

In contrast, the wavelength controller 6 may control the second solid-state laser unit 12 to vary the second wavelength of the second pulsed laser light beam 71B on a condition that the absolute value of the difference $\delta\lambda$ between the value of the target wavelength $\lambda t$ and the value of the third wavelength $\lambda 3$ detected by calculation exceeds the predetermined value $\delta\lambda 1$. More specifically, the setting wavelength $\lambda 2$ of the second laser diode 40 in the second solid-state laser unit 12 may be controlled to control the oscillation wavelength of the second laser diode 40, thereby varying the second wavelength of the second pulsed laser light beam 71B.

Other than the above, the process of optimization of the entry angle of light entering the nonlinear crystal on the basis of a result of detection derived from each of the first and second photodetectors 93 and 94 in the wavelength conversion system 15 may be substantially similar to that in the laser apparatus used for the exposure apparatus illustrated in FIG. 2.

The foregoing process of wavelength optimization on the basis of a result of detection of the third wavelength $\lambda 3$ with use of the first and second wavelength monitors 60A and 60B and the foregoing process of optimization of the entry angle of light entering the nonlinear crystal on the basis of the result of detection derived from each of the first and second photodetectors 93 and 94 may be each repeated a plurality of times.

Figure 11:
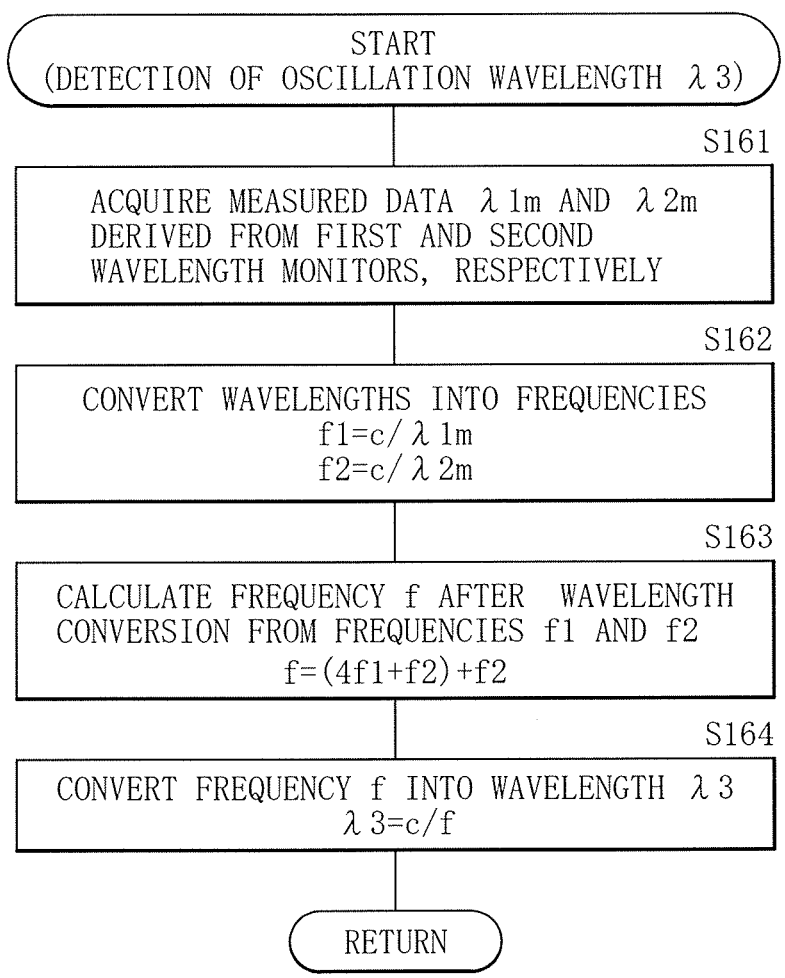
FIG. 11 is a flow chart illustrating a process of detecting a value of a third wavelength in the laser apparatus used for the exposure apparatus illustrated in FIG. 10.

FIG. 11 is a flow chart illustrating a process of detecting the value of the third wavelength $\lambda 3$ with use of the first and second wavelength monitors 60A and 60B in the laser apparatus used for the exposure apparatus illustrated in FIG. 10.

In the present embodiment, control operations by the wavelength controller 6 other than the process of detecting the value of the third wavelength $\lambda 3$ may be substantially similar to those in the foregoing first embodiment. Even in the present embodiment, processes substantially similar to the processes illustrated in the flow charts in FIGS. 3 to 7 may be performed as the control operations by the wavelength controller 6.

Note that the wavelength controller 6 may perform processes illustrated in FIG. 11 as the processes in the steps S103 and S109 in the flow chart in FIG. 3.

The wavelength controller 6 may acquire the data of the measured wavelength λ1m and the data of the measured wavelength λ2m derived from the first and second wavelength monitors 60A and 60B, respectively (step S161).

Subsequently, the wavelength controller 6 may convert the measured wavelengths λ1m and λ2m into respective frequencies by the following expression (step S162).

$$f1=c/\lambda 1m$$

$$f2=c/\lambda 2m$$

where c may be velocity of light.

Thereafter, the wavelength controller 6 may calculate the frequency f after wavelength conversion into the third wavelength λ3 from the data of the frequencies f1 and f2 by the following expression (step S163).

$$f=(4f1+f2)+f2$$

At this occasion, the LBO crystal 21 and CLBO crystal 22 may convert the first seed light outputted from the first laser diode 20 into light with a frequency 4f1. Moreover, the CLBO crystal 18 may convert entering light with the frequency 4f1 and entering light with the frequency f2 into light with a wavelength 4f1+f2, and the CLBO crystal 19 may convert entering light with the frequency (4f1+f2) and entering light with the frequency f2 into light with a frequency (4f1+f2)+f2.

Subsequently, the wavelength controller 6 may convert the frequency f into the third wavelength λ3 by the following expression (step S164).

$$\lambda 3=c/f$$

4.3 Workings

According to the laser apparatus used for the exposure apparatus of the present embodiment, the third wavelength λ3 may be detected by calculation from the measured wavelengths λ1m and λ2m respectively measured by the first and second wavelength monitors 60A and 60B. Moreover, in a case where the absolute value of the difference δλ between the value of the target wavelength λt and the value of the third wavelength λ3 detected by calculation is equal to or less than the predetermined value δλ1, the setting wavelength λ1 of the first laser diode 20 may be controlled. In a case where the difference δλ exceeds the predetermined value δλ1, the setting wavelength λ2 of the second laser diode 40 may be controlled. This makes it possible for the third wavelength λ3 of the third pulsed laser light beam 71C to approach the target wavelength λt.

Other workings may be substantially similar to those in the laser apparatus used for the exposure apparatus illustrated in FIG. 2.

5. Third Embodiment

Next, description is given of a laser apparatus that is used for an exposure apparatus and includes a solid-state laser system according to a third embodiment of the present disclosure. Note that substantially same components as the components of the laser apparatus used for the exposure apparatus according to any of the foregoing comparative example and the foregoing first and second embodiments are denoted by same reference numerals, and redundant description thereof is omitted.

5.1 Configuration

Figure 12:
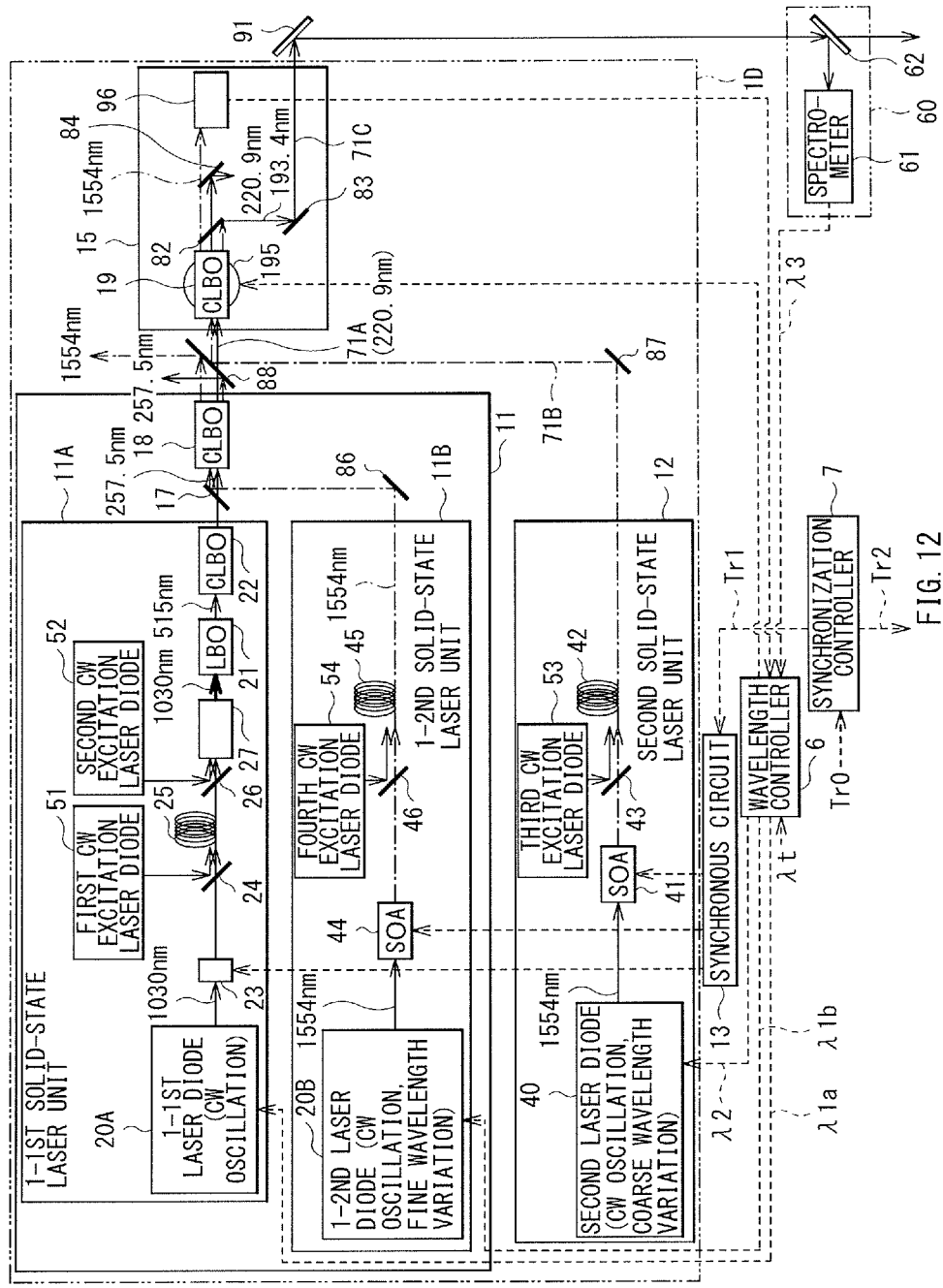
FIG. 12 schematically illustrates a configuration example of an essential part of a laser apparatus used for an exposure apparatus according to a third embodiment.

FIG. 12 schematically illustrates a configuration example of an essential part of the laser apparatus that is used for the exposure apparatus and includes a solid-state laser system 1D according to the third embodiment of the present disclosure.

The laser apparatus used for the exposure apparatus according to the present embodiment may include the solid-state laser system 1D in place of the solid-state laser system 1A in the first embodiment illustrated in FIG. 2. The solid-state laser system 1D may include the first solid-state laser unit 11, the second solid-state laser unit 12, the wavelength conversion system 15, a high reflection mirror 87, and a dichroic mirror 88.

The first solid-state laser unit 11 may include a 1-1st solid-state laser unit 11A and a 1-2nd solid-state laser unit 11B. The first solid-state laser unit 11 may further include the dichroic mirror 17, the CLBO crystal 18, and a high reflection mirror 86.

The first solid-state laser unit 11 may be configured to output the first pulsed laser light beam 71A with the first wavelength toward the wavelength conversion system 15 via the dichroic mirror 17. The first pulsed laser light beam 71A may be generated on the basis of 1-1st seed light and 1-2nd seed light. The first wavelength may be about 220.9 nm.

The high reflection mirror 86 may be so disposed as to reflect a pulsed laser light beam outputted from the 1-2nd solid-state laser unit 11B at high reflectivity, thereby allowing the thus-reflected pulsed laser light beam to enter the dichroic mirror 17. The dichroic mirror 17 may be coated with a film that allows a pulsed laser light beam outputted from the 1-1st solid-state laser unit 11A to pass therethrough at high transmittance and reflects the pulsed laser light beam outputted from the 1-2nd solid-state laser unit 11B at high reflectivity. The dichroic mirror 17 may be so disposed as to allow the pulsed laser light beam outputted from the 1-1st solid-state laser unit 11A and the pulsed laser light beam outputted from the 1-2nd solid-state laser unit 11B to enter the CLBO crystal 18 while optical path axes of the pulsed laser light beams are substantially coincident with each other.

A pulsed laser light beam with a wavelength of about 257.5 nm from the 1-1st solid-state laser unit 11A and a pulsed laser light beam with a wavelength of about 1554 nm from the 1-2nd solid-state laser unit 11B may enter the CLBO crystal 18. The CLBO crystal 18 may output, as the first pulsed laser light beam 71A, a pulsed laser light beam with a wavelength of about 220.9 nm corresponding to a sum frequency of a wavelength of about 257.5 nm and a wavelength of about 1554 nm. The CLBO crystal 18 may further output a pulsed laser light beam with a wavelength of about 257.5 nm and a pulsed laser light beam with a wavelength of about 1554 nm.

The 1-1st solid-state laser unit 11A may include a 1-1st laser diode 20A. The 1-1st laser diode 20A may be a distributed-feedback laser diode that oscillates in the CW single longitudinal mode to output the 1-1st seed light with a wavelength of about 1030 nm. A signal line that receives data of a setting wavelength λ1a from the wavelength controller 6 may be provided to the 1-1st laser diode 20A.

Other configurations of the 1-1st solid-state laser unit 11A may be substantially similar to those of the first solid-state laser unit 11 in FIG. 2.

The 1-2nd solid-state laser unit 11B may include a 1-2nd laser diode 20B, a semiconductor optical amplifier 44, a third amplifier 45, a beam splitter 46, and a fourth CW excitation laser diode 54.

The 1-2nd laser diode 20B may be an external cavity laser diode that oscillates in the CW single longitudinal mode to output the 1-2nd seed light with a wavelength of about 1554 nm. The 1-2nd laser diode 20B may be an external cavity laser diode that varies a fine wavelength, e.g., a narrow wavelength range of about 0.4 pm at high velocity. A signal line that receives data of a setting wavelength $\lambda 1b$ from the wavelength controller 6 may be provided to the 1-2nd laser diode 20B.

The second solid-state laser unit 12 may have a configuration substantially similar to that of the second solid-state laser unit 12 in FIG. 2. The second solid-state laser unit 12 may be configured to output the second pulsed laser light beam 71B with the second wavelength toward the wavelength conversion system 15 via the high reflection mirror 87 and the dichroic mirror 88. The second pulsed laser light beam 71B with the second wavelength may be generated on the basis of the second seed light.

The synchronous circuit 13 may be configured to output a predetermined trigger signal to each of the optical shutter 23, the semiconductor optical amplifier 41, and the semiconductor optical amplifier 44 on the basis of the first trigger signal Tr1 from the synchronization controller 7.

The wavelength conversion system 15 may include the CLBO crystal 19, the dichroic mirrors 82 and 84, the high reflection mirror 83, a photodetector 96, and a rotation stage 195.

The rotation stage 195 may be a rotation mechanism that varies the entry angle $\theta 2$ of light entering the CLBO crystal 19. A rotation angle of the rotation stage 195 may be controlled by the wavelength controller 6.

The photodetector 96 may be disposed in an optical path of a pulsed laser light beam with a wavelength different from a wavelength of about 193.4 nm of the third pulsed laser light beam 71C that is converted light from the CLBO crystal 19. The photodetector 96 may be disposed, for example, in an optical path of a pulsed laser light beam with a wavelength of about 1554 nm having passed through the dichroic mirrors 82 and 84, and may detect light intensity of the pulsed laser light beam with a wavelength of about 1554 nm. A signal indicating a detection value derived from the photodetector 96 may be outputted to the wavelength controller 6. The rotation angle of the rotation stage 195 may be controlled by the wavelength controller 6 so as to change the detection value derived from the photodetector 96 smaller.

The high reflection mirror 87 may be so disposed as to allow the second pulsed laser light beam 71B outputted from the second solid-state laser unit 12 to enter the dichroic mirror 88. The dichroic mirror 88 may be coated with a film that reflects light with a wavelength of about 1554 nm and light with a wavelength of about 257.5 nm at high reflectivity and allows light with a wavelength of about 220.9 nm that is the first pulsed laser light beam 71A to pass therethrough at high transmittance. The dichroic mirror 88 may be so disposed as to allow the second pulsed laser light beam 71B with a wavelength of about 1554 nm and the first pulsed laser light beam 71A with a wavelength of about 220.9 nm to enter the CLBO crystal 19 while optical path axes of the second pulsed laser light beam 71B and the first pulsed laser light beam 71A are substantially coincident with each other.

Other configurations may be substantially similar to those of the laser apparatus used for the exposure apparatus illustrated in FIG. 2.

5.2 Operation

The wavelength controller 6 may receive a signal indicating the value of the target wavelength $\lambda t$ from the exposure apparatus controller 5 via the laser controller 3. The wavelength controller 6 may transmit data of an initial setting wavelength $\lambda 10a$ as the setting wavelength $\lambda 1a$ to the 1-1st laser diode 20A so as to cause the third wavelength $\lambda 3$ of the third pulsed laser light beam 71C, which is to be outputted from the wavelength conversion system 15, to be an initial wavelength of about 193.4 nm. The wavelength controller 6 may also transmit data of an initial setting wavelength $\lambda 10b$ as the setting wavelength $\lambda 1b$ to the 1-2nd laser diode 20B so as to cause the third wavelength $\lambda 3$ of the third pulsed laser light beam 71C, which is to be outputted from the wavelength conversion system 15, to be an initial wavelength of about 193.4 nm. The wavelength controller 6 may also transmit data of the initial setting wavelength $\lambda 20$ as the setting wavelength $\lambda 2$ to the second laser diode 40 so as to cause the third wavelength $\lambda 3$ of the third pulsed laser light beam 71C, which it to be outputted from the wavelength conversion system 15, to be an initial wavelength of about 193.4 nm. Thereafter, the wavelength controller 6 may cause the 1-1st and 1-2nd laser diodes 20A and 20B and the second laser diode 40 to oscillate in the CW mode.

As a result, the 1-1st solid-state laser unit 11A may output the pulsed laser light beam with a wavelength of about 257.5 nm. Moreover, the 1-2nd solid-state laser unit 11B may output the pulsed laser light beam with a wavelength of about 1554 nm.

The CLBO crystal 18 may generate a pulsed laser light beam with a wavelength of about 220.9 nm corresponding to a sum frequency of a wavelength of about 257.5 nm and a wavelength of about 1554 nm. The first solid-state laser unit 1 may output the pulsed laser light beam with a wavelength of about 220.9 nm as the first pulsed laser light beam 71A.

In contrast, the second solid-state laser unit 12 may output the second pulsed laser light beam 71B with a wavelength of about 1554 nm.

The first pulsed laser light beam 71A and the second pulsed laser light beam 71B may enter the wavelength conversion system 15. The wavelength conversion system 15 may output the third pulsed laser light beam 71C with a wavelength of about 193.4 nm that is the third wavelength $\lambda 3$ converted from a wavelength of about 220.9 nm and a wavelength of about 1554 nm. The wavelength monitor 60 may detect the value of the third wavelength $\lambda 3$ of the third pulsed laser light beam 71C outputted from the wavelength conversion system 15.

The wavelength controller 6 may control the first solid-state laser unit 11 to vary the first wavelength of the first pulsed laser light beam 71A on a condition that the absolute value of the difference $\delta \lambda (= \lambda 3 - \lambda t)$ between the value of the target wavelength $\lambda t$ and the value of the third wavelength $\lambda 3$ detected by the wavelength monitor 60 is equal to or less than the predetermined value $\delta \lambda 1$. More specifically, the setting wavelength $\lambda 1b$ of 1-2nd laser diode 20B in the first solid-state laser unit 11 may be controlled to control an oscillation wavelength of the 1-2nd laser diode 20B, thereby varying the first wavelength of the first pulsed laser light beam 71A. Moreover, the predetermined value $\delta \lambda 1$ may be about 0.4 pm, for example. Thus, the third wavelength $\lambda 3$ of the third pulsed laser light beam 71C to be outputted from the wavelength conversion system 15 may approach the target wavelength λt at high velocity.

In contrast, the wavelength controller 6 may control the second solid-state laser unit 12 to vary the second wavelength of the second pulsed laser light beam 71B on a condition that the absolute value of the difference δλ between the value of the target wavelength λt and the value of the third wavelength λ3 detected by the wavelength monitor 60 exceeds the predetermined value δλ1. More specifically, the setting wavelength λ2 of the second laser diode 40 in the second solid-state laser unit 12 may be controlled to control the oscillation wavelength of the second laser diode 40, thereby varying the second wavelength of the second pulsed laser light beam 71B.

Subsequently, the wavelength controller 6 may control the rotation angle of the first rotation stage 195 so as to change the detection value derived from the photodetector 96 smaller and closer to a minimal value, thereby controlling the entry angle θ2 of light entering the CLBO crystal 19. Thus, wavelength conversion efficiency in the CLBO crystal 19 may be maximized.

Accordingly, the third wavelength λ3 of the third pulsed laser light beam 71C to be outputted from the wavelength conversion system 15 may approach the target wavelength λt, and a decrease in wavelength conversion efficiency in the CLBO crystal 19 that is a non-linear crystal may be suppressed.

Moreover, the foregoing process of wavelength optimization on the basis of a result of detection of the third wavelength λ3 derived from the wavelength monitor 60 and the foregoing process of optimization of the entry angle of light entering the nonlinear crystal on the basis of a result of detection derived from the photodetector 96 may be each repeated a plurality of times.

Next, description is given of a more specific example of a control operation by the wavelength controller 6 in the present embodiment with reference to FIGS. 13 to 16.

Figure 13:
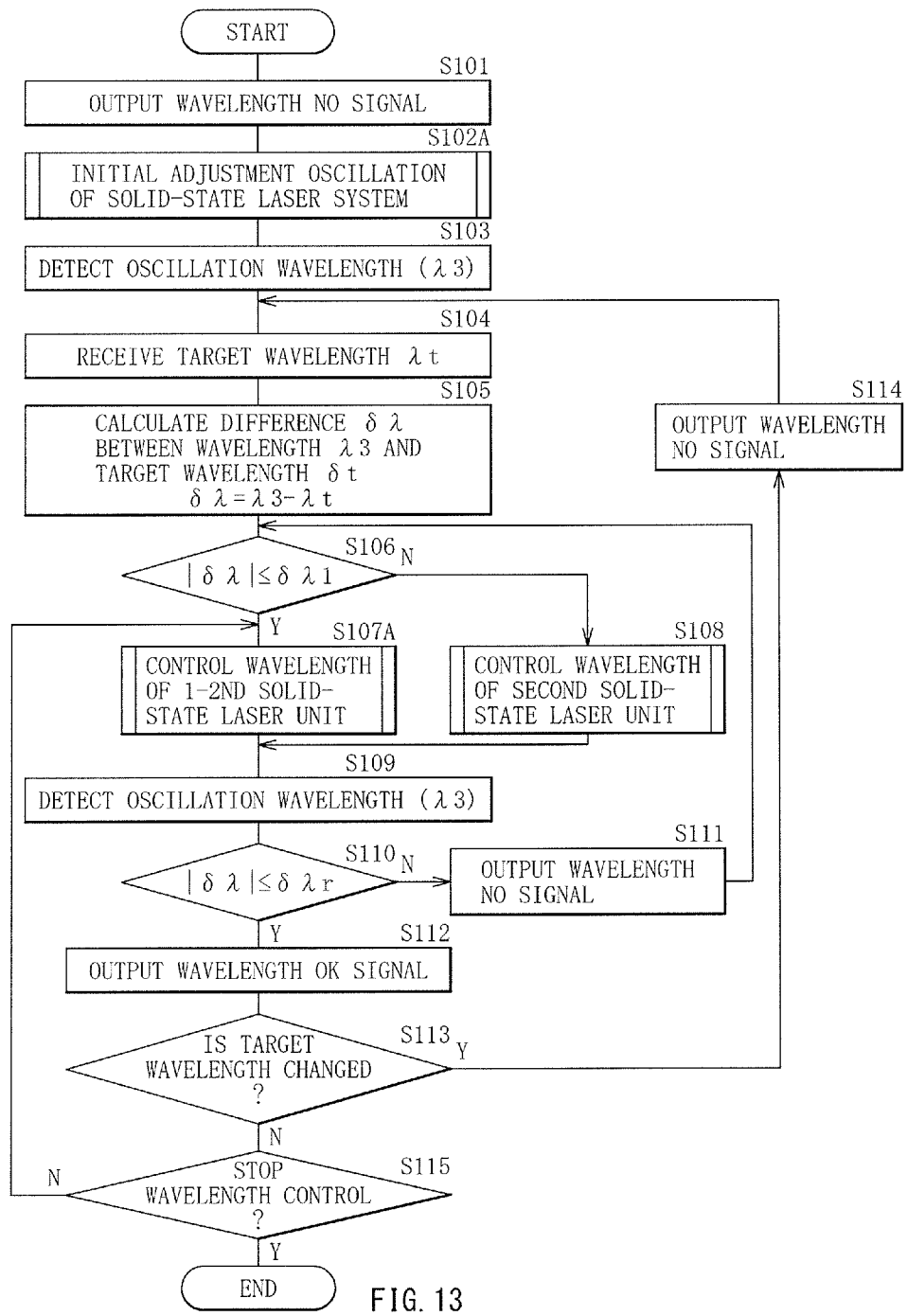
FIG. 13 is a main flow chart illustrating an example of a flow of control by a wavelength controller in the laser apparatus used for the exposure apparatus illustrated in FIG. 12.

FIG. 13 is a main flow chart illustrating an example of a flow of control by the wavelength controller 6 in the present embodiment.

The wavelength controller 6 may perform a process in step S102A in place of the foregoing step S102 in the flow chart in FIG. 3. Moreover, the wavelength controller 6 may perform a process in step S107A in place of the step S107 in the flow chart in FIG. 3. Other processes in the main flow chart in FIG. 13 may be substantially similar to the foregoing processes in the flow chart in FIG. 3.

In the step S102A, the wavelength controller 6 may cause the solid-state laser system 1D to perform initial adjustment oscillation for initial setting of the solid-state laser system 1D.

In the step S107A, the wavelength controller 6 may perform a process of controlling the wavelength of the 1-2nd solid-state laser unit 11B.

Figure 14:
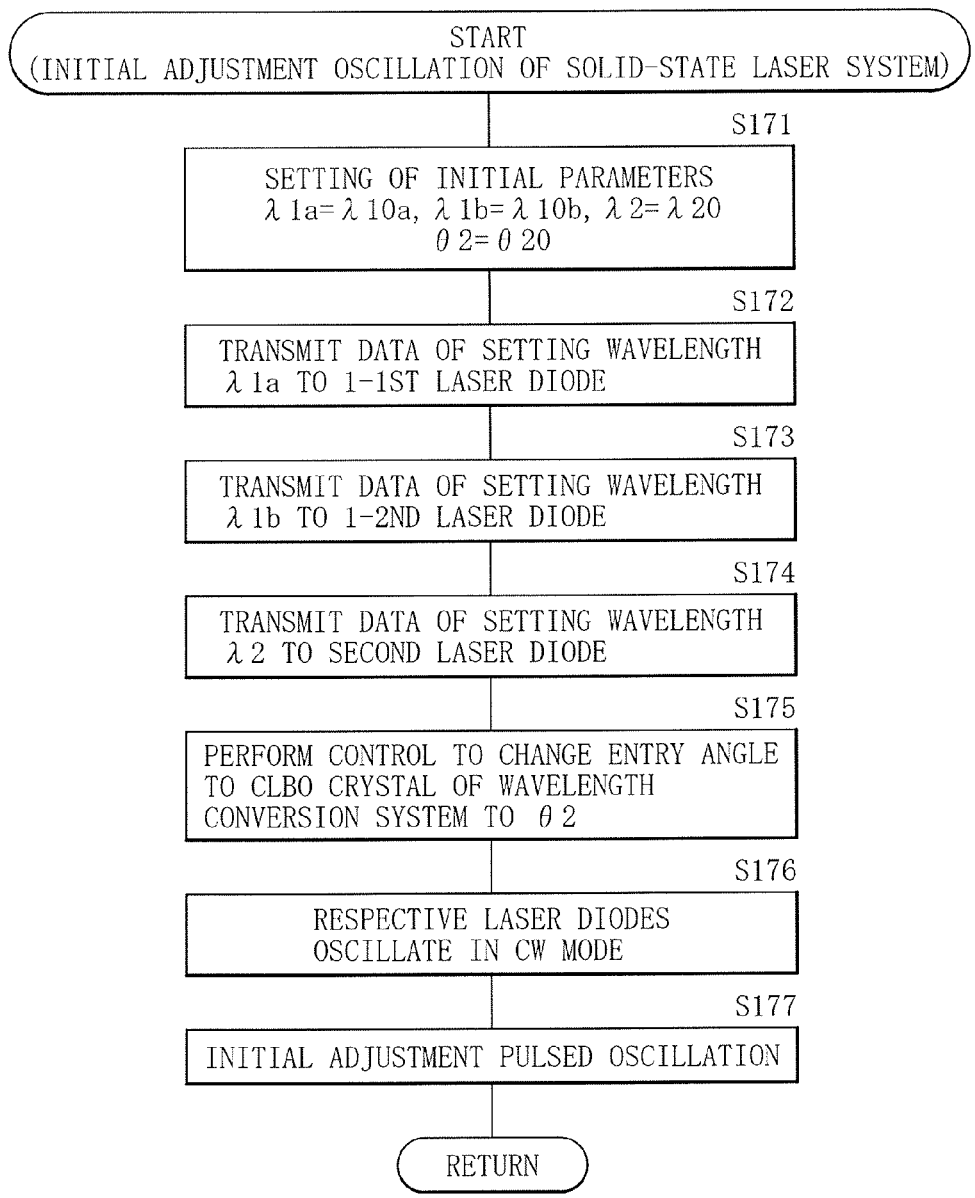
FIG. 14 is a sub-flow chart illustrating details of a process in step S102A in the main flow chart illustrated in FIG. 13.

FIG. 14 is a sub-flow chart illustrating details of the process in the step S102A in the main flow chart illustrated in FIG. 13. The wavelength controller 6 may perform a process illustrated in FIG. 14 as the initial adjustment oscillation of the solid-state laser system 1D.

First, the wavelength controller 6 may set initial parameters (step S171). Setting of the initial parameters may include setting of the setting wavelengths λ1$a$, λ1$b$, and λ2 and the entry angle θ2 by the following expressions.

$$\lambda 1a = \lambda 10a, \lambda 1b = \lambda 10b, \text{ and } \lambda 2 = \lambda 20$$

$$\theta 2 = \theta 20$$

In other words, the wavelength controller 6 may set the setting wavelength λ1$a$ of the 1-1st the laser diode 20A to the initial setting wavelength λ10$a$, and may set the setting wavelength λ1$b$ of the 1-2nd the laser diode 20B to the initial setting wavelength λ10$b$. Moreover, the wavelength controller 6 may set the setting wavelength λ2 of the second laser diode 40 to the initial setting wavelength λ20. Further, the entry angle θ2 of light entering the CLBO crystal 19 may be set to θ20.

Subsequently, the wavelength controller 6 may transmit data of the setting wavelength λ1$a$ to the 1-1st laser diode 20A (step S172). Thereafter, the wavelength controller 6 may transmit data of the setting wavelength λ1$b$ to the 1-2nd laser diode 20B (step S173). Subsequently, the wavelength controller 6 may transmit data of the setting wavelength λ2 to the second laser diode 40 (step S174).

Subsequently, the wavelength controller 6 may control the rotation angle of the rotation stage 195, thereby performing control to change the entry angle of the light entering the CLBO crystal 19 of the wavelength conversion system 15 to θ2 (step S175).

Thereafter, the wavelength controller 6 may cause the 1-1st and 1-2nd laser diodes 20A and 20B, and the second laser diode 40 to oscillate in the CW mode (step S176). Accordingly, the 1-1st laser diode 20A may output a CW laser light beam with the setting wavelength λ1$a$ as the 1-1st seed light, and the 1-2nd laser diode 20B may output a CW laser light beam with the setting wavelength λ1$b$ as the 1-2nd seed light. Moreover, the second laser diode 40 may output a CW laser light beam with the setting wavelength λ2 as the second seed light.

Subsequently, the wavelength controller 6 may cause the synchronization controller 7 to output the first and second trigger signals Tr1 and Tr2 at a predetermined repetition frequency via the laser controller 3 to perform initial adjustment pulsed oscillation (step S177). Thereafter, the wavelength controller 6 may return to the main flow in FIG. 13.

Figure 15:
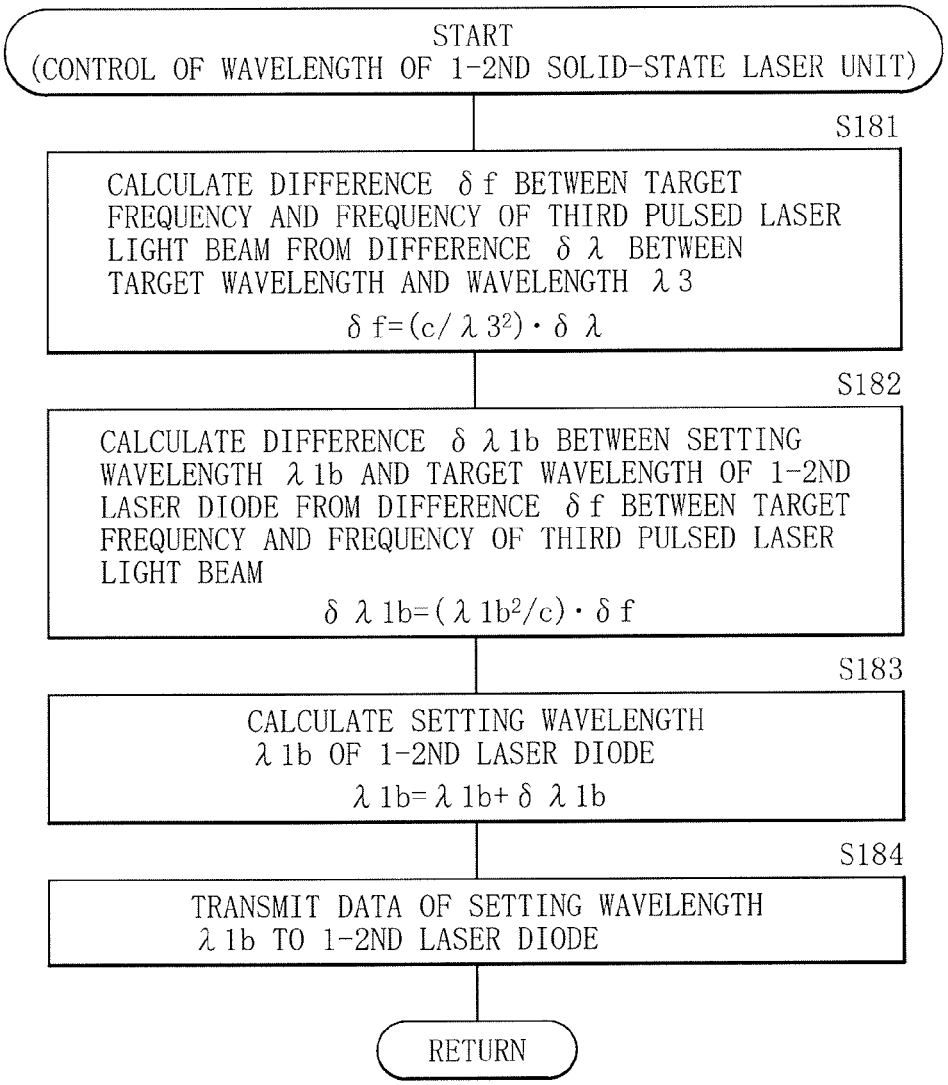
FIG. 15 is a sub-flow chart illustrating details of a process in step S107A in the main flow chart illustrated in FIG. 13.

FIG. 15 is a sub-flow chart illustrating details of the process in the step S107A in the main flow chart illustrated in FIG. 13. The wavelength controller 6 may perform a process illustrated in FIG. 15 as a process of controlling the wavelength of the 1-2nd solid-state laser unit 11B.

The wavelength controller 6 may calculate the difference δf between the target frequency f and the frequency of the third pulsed laser light beam 71C by the following expression from the difference δλ between the value of the target wavelength λt and the value of the third wavelength λ3 detected by the wavelength monitor 60 (step S181).

$$\delta f = (c/\lambda 3^2) \cdot \delta \lambda$$

where c may be velocity of light.

Subsequently, the wavelength controller 6 may calculate a difference δλ1$b$ between the setting wavelength λ1$b$ and the target wavelength of the 1-2nd laser diode 20B by the following expression from the difference δf between the target frequency f and the frequency of the third pulsed laser light beam 71C (step S182).

$$\delta \lambda 1b = (\lambda 1b^2/c) \cdot \delta f$$

Thereafter, the wavelength controller 6 may calculate the setting wavelength λ1$b$ of the 1-2nd laser diode 20B by the following expression (step S183).

$$\lambda 1b = \lambda 1b + \delta \lambda 1b$$

Subsequently, the wavelength controller 6 may transmit data of the setting wavelength λ1$b$ to the 1-2nd laser diode 20B (step S184), and may return to the main flow in FIG. 13.

Figure 16:
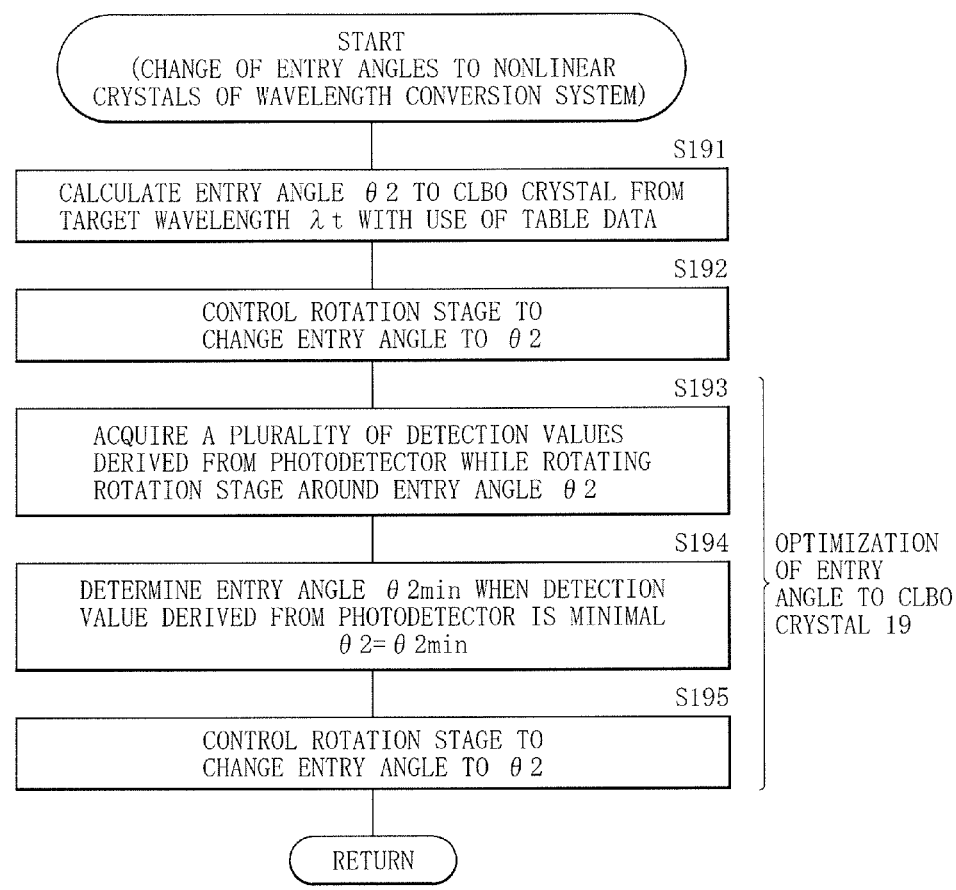
FIG. 16 is a flow chart in a case where a process in step S145 in the flow chart illustrated in FIG. 6 is applied to the laser apparatus used for the exposure apparatus illustrated in FIG. 12.
Figure 17:
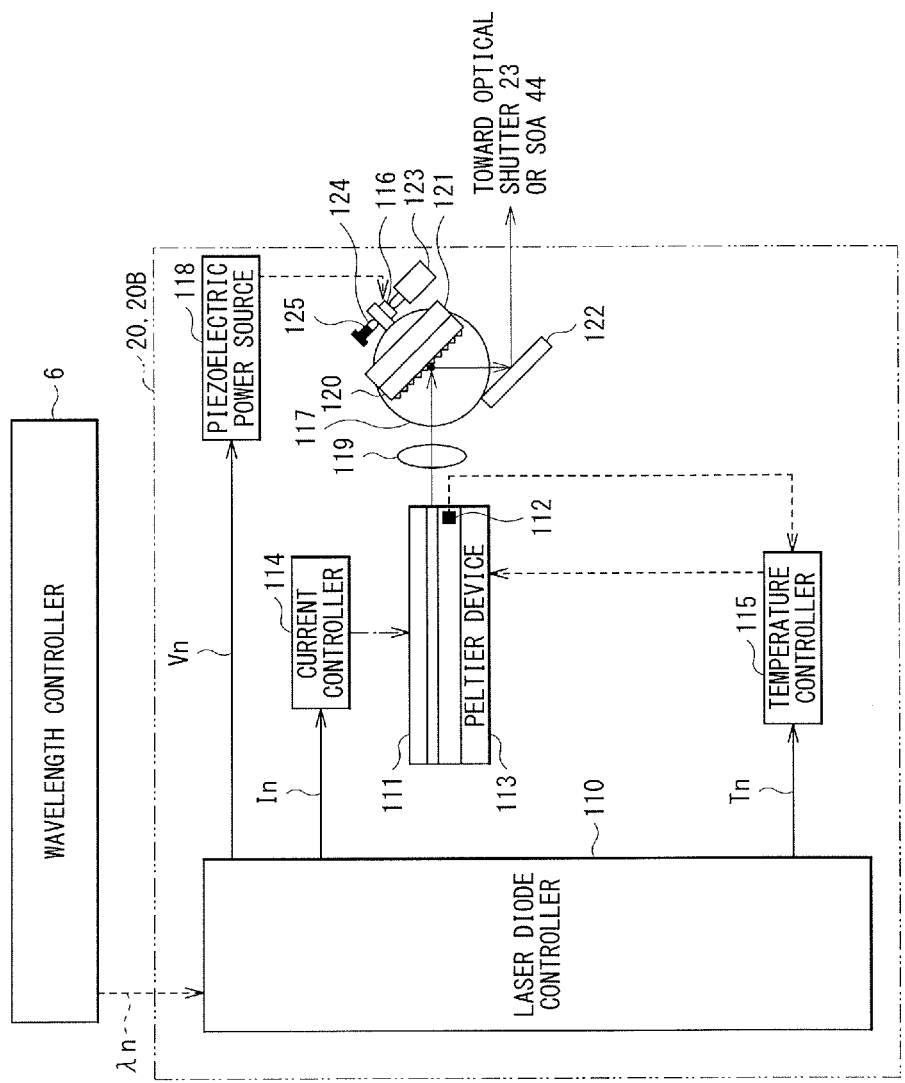
FIG. 17 schematically illustrates a configuration example of an external cavity laser diode.

FIG. 16 is a flow chart in a case where the process in the step S145 in the flow chart illustrated in FIG. 6 is applied to the laser apparatus used for the exposure apparatus illustrated in FIG. 12.

In the present embodiment, details of the process in the step S108 in the main flow chart illustrated in FIG. 13 may be substantially similar to the process in the sub-flow chart illustrated in FIG. 6. Alternatively, the process in the sub-flow chart illustrated in FIG. 16 may be performed as the process in the step S145.

The wavelength controller 6 may calculate the entry angle θ2 of the light entering the CLBO crystal 19 from the target wavelength λt with use of table data (step S191). The wavelength controller 6 may store a relationship between the target wavelength λt and the entry angle θ2 of the light entering the CLBO crystal 19 as table data in an unillustrated storage section in advance.

Subsequently, the wavelength controller 6 may control the rotation stage 195 to change the entry angle to the CLBO crystal 19 to θ2 (step S192).

Thereafter, the wavelength controller 6 may acquire a plurality of detection values derived from the photodetector 96 while rotating the rotation stage 195 around the entry angle θ2 (step S193). The wavelength controller 6 may then determine an entry angle θ2min when the detection value derived from the photodetector 96 is minimal by the following expression (step S194).

$$\theta 2 = \theta 2min$$

Subsequently, the wavelength controller 6 may control the rotation stage 195 to change the entry angle to the CLBO crystal 19 to θ2 (step S195), and return to the main flow in FIG. 13.

The wavelength controller 6 may optimize the entry angle θ2 of the light entering the CLBO crystal 19 by the processes in the steps S193 to S195 mentioned above.

5.3 Workings

According to the laser apparatus used for the exposure apparatus of the present embodiment, in a case where the absolute value of the difference δλ between the value of the target wavelength λt and the value of the third wavelength λ3 detected by the wavelength monitor 60 is equal to or less than the predetermined value δλ1, the setting wavelength λ1b of the 1-2nd laser diode 20B may be controlled. In a case where the absolute value of the difference S exceeds the predetermined value δλ1, the setting wavelength λ2 of the second laser diode 40 may be controlled. This makes it possible for the third wavelength λ3 of the third pulsed laser light beam 71C to approach the target wavelength λt.

Moreover, in the case where the absolute value of the difference δλ is equal to or less than the predetermined value δλ1, the third wavelength λ3 may approach the target wavelength λt at high velocity, and even if the absolute value of the difference δλ exceeds the predetermined value δλ1, the third pulsed laser light beam 71C may be outputted with high conversion efficiency. According to the present embodiment, as compared with the embodiment in FIG. 2, high wavelength conversion efficiency may be maintained even though the entry angle θ1 of the light entering the CLBO crystal 18 is not optimized.

6. Wavelength Tunable Laser Diode

Next, description is given of a specific configuration example of a wavelength tunable laser diode that is applicable as the first laser diode 20, the 1-2nd laser diode 20B, and the second laser diode 40 mentioned above.

Note that substantially same components as the components of the laser apparatus used for the exposure apparatus according to any of the foregoing comparative example and the first to third embodiments are denoted by same reference numerals, and redundant description thereof is omitted.

6.1 Fine Wavelength Tunable Laser Diode

6.1.1 Configuration

First, description is given of a specific configuration example of a fine wavelength tunable laser diode that is applicable as the first laser diode 20 and the 1-2nd laser diode 20B mentioned above with reference to FIG. 17.

It is possible for the external cavity laser diode to control an oscillation wavelength within a frequency variation of 20 GHz without mode hopping. It is to be noted that, for example, technologies described in U.S. Pat. No. 7,970,024 and U.S. Pat. No. 8,416,831 are applicable to the external cavity laser diode.

The fine wavelength tunable laser diode may be an external cavity laser diode. The external cavity laser diode may include a laser diode controller 110, a semiconductor device 111, a temperature sensor 112, a Peltier device 113, a current controller 114, a temperature controller 115, and a rotation stage 117 provided with a piezoelectric device 116. The external cavity laser diode may further include a piezoelectric power source 118, a collimator lens 119, a grating 120, a grating holder 121, a steering mirror 122, a mircometer 123, a pin 124, and a reaction spring 125.

A signal line that receives data of the setting wavelength λn from the wavelength controller 6 may be provided to the laser diode controller 110. A signal line that receives data of a voltage value Vn from the laser diode controller 110 may be provided to the piezoelectric power source 118. A signal line that receives data of a current value In from the laser diode controller 110 may be provided to the current controller 114. A signal line that receives data of a setting temperature Tn from the laser diode controller 110 may be provided to the temperature controller 115.

The grating 120 may be disposed on output side of the semiconductor device 111 with the collimator lens 119 in between in Littrow arrangement in which a diffraction angle and an entry angle of first-order diffracted light is equal to each other. The grating 120 may be fixed to the rotation stage 117 with the grating holder 121 in between so as to vary the entry angle to the grating 120.

The steering mirror 122 may be so disposed by an unillustrated holder as to allow a mirror surface thereof to be substantially parallel to a diffraction surface of the grating 120.

The temperature sensor 112 and the Peltier device 113 may be fixed to the semiconductor device 111.

6.1.2 Operation

The laser diode controller 110 may control a rotation angle of the rotation stage 117 and a temperature of the semiconductor device 111 in advance so as to cause laser oscillation in a fine wavelength region.

The laser diode controller 110 may store, in advance as table data, a relationship, which does not cause mode hopping, among a setting wavelength λ, a current value I that is to flow through the semiconductor device 111, and a voltage value V that is to be applied to the piezoelectric device 116.

The laser diode controller 110 may calculate a current value In that is to flow through the semiconductor device 111 and a voltage value Vn that is to be applied to the piezoelectric device 116 from the foregoing table data upon reception of data of a setting wavelength λn from the wavelength controller 6.

The laser diode controller 110 may transmit, to the current controller 114, data of the current value In that is to flow through the semiconductor device 111. The laser diode controller 110 may also transmit, to the piezoelectric power source 118, data of the voltage value Vn of the piezoelectric device 116 that controls the rotation angle of the grating 120.

The entry angle to the grating 120 may be varied by the piezoelectric device 116, and a refractive index in an active layer of a semiconductor may be varied by a current flowing through the semiconductor device ill. Accordingly, the oscillation wavelength of the laser diode may approach the setting wavelength λn at high velocity while suppressing occurrence of mode hopping. Thereafter, 0th-order light of the grating 120 may be outputted, and a CW laser light beam may be outputted to outside by the steering mirror 122.

6.2 Coarse Wavelength Tunable Laser Diode

6.2.1 Configuration

Figure 18:
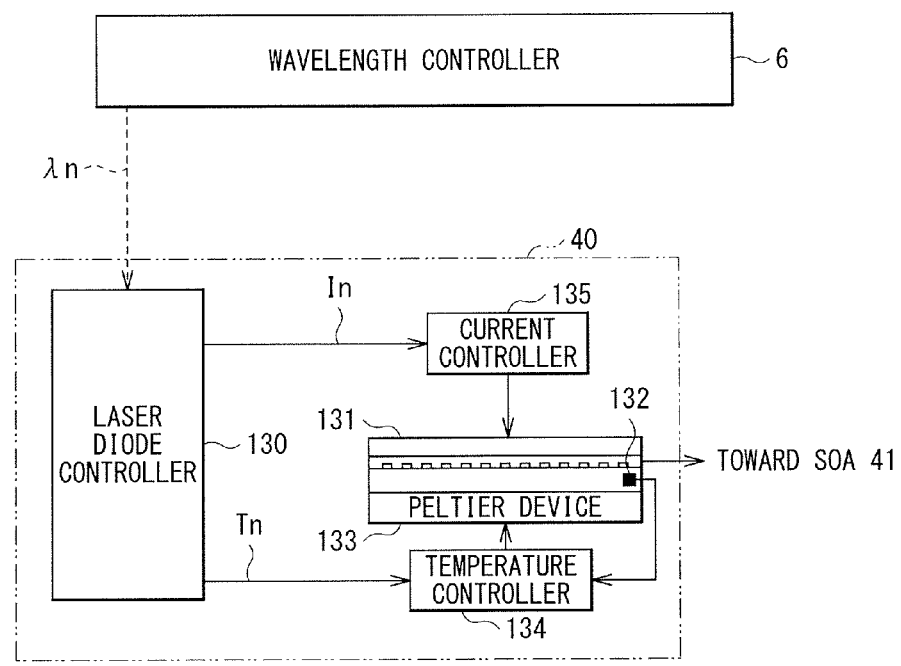
FIG. 18 schematically illustrates a configuration example of a distributed-feedback laser diode.

Next, description is given of a specific configuration example of a coarse wavelength tunable laser diode that is applicable as the second laser diode 40 with reference to FIG. 18.

The distributed-feedback laser diode may control a temperature of a semiconductor device to control a frequency in a range of a frequency of about 1.2 THz without mode hopping.

The coarse wavelength tunable laser diode may be a distributed-feedback laser diode. The distributed-feedback laser diode may include a laser diode controller 130, a semiconductor device 131, a temperature sensor 132, a Peltier device 133, a temperature controller 134, and a current controller 135.

A signal line that receives data of the setting wavelength λn from the wavelength controller 6 may be provided to the laser diode controller 130. A signal line that receives data of the current value In from the laser diode controller 130 may be provided to the current controller 135. A signal line that receives data of the setting temperature Tn from the laser diode controller 130 may be provided to the temperature controller 134.

6.2.2 Operation

Figure 19:
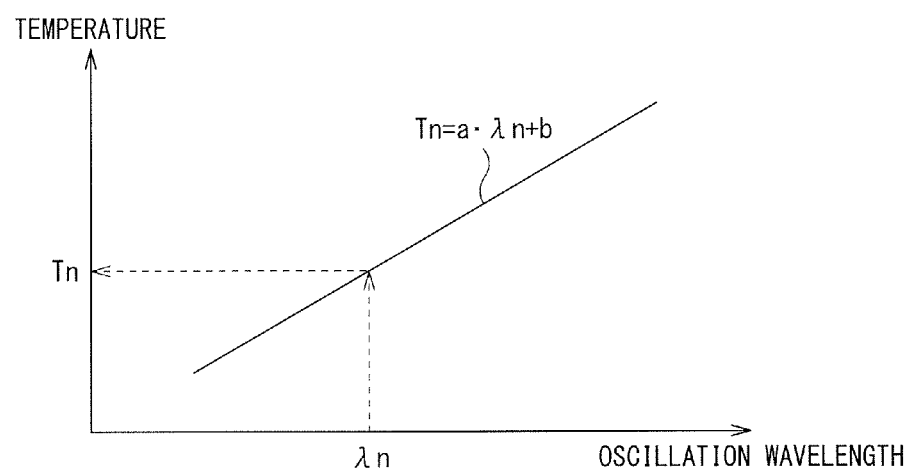
FIG. 19 illustrates an example of a relationship between a temperature and an oscillation wavelength in the distributed-feedback laser diode illustrated in FIG. 18.

FIG. 19 illustrates an example of a relationship between a temperature and an oscillation wavelength of the semiconductor device 131 in the coarse wavelength tunable laser diode illustrated in FIG. 18. In FIG. 19, a horizontal axis may indicate the oscillation wavelength, and a vertical axis may indicate the temperature.

The laser diode controller 130 may store, in advance, a relational expression of the setting temperature Tn and the setting wavelength λn illustrated in FIG. 19, e.g., Tn=a·λn+b, where each of "a" and "b" may be a constant determined by the semiconductor device 131. Upon reception of data of the setting wavelength λn from the wavelength controller 6, the laser diode controller 130 may determine the setting temperature Tn of the semiconductor device 131 from the foregoing relational expression, and may transmit data of the setting temperature Tn to the temperature controller 134.

The temperature controller 134 may control a current that is to flow through the Peltier device 133 on the basis of a detection value derived from the temperature sensor 132 so as to allow the temperature of the semiconductor device 131 to approach the setting temperature Tn.

The laser diode controller 130 may transmit data of the current value In to the current controller 135 so as to change the current value In that is to flow through the semiconductor device 131 to a predetermined current value, e.g., a current value calculated from the relational expression in FIG. 19. As a result, the semiconductor device 131 may output a CW laser light beam with the setting wavelength Tn.

7. Wavelength Monitor

Next, description is given of a specific configuration example of the foregoing wavelength monitor 60. It is to be noted that each of the first and second wavelength monitors 60A and 60B in FIG. 10 may have a substantially similar configuration.

7.1 Configuration

Figure 20:
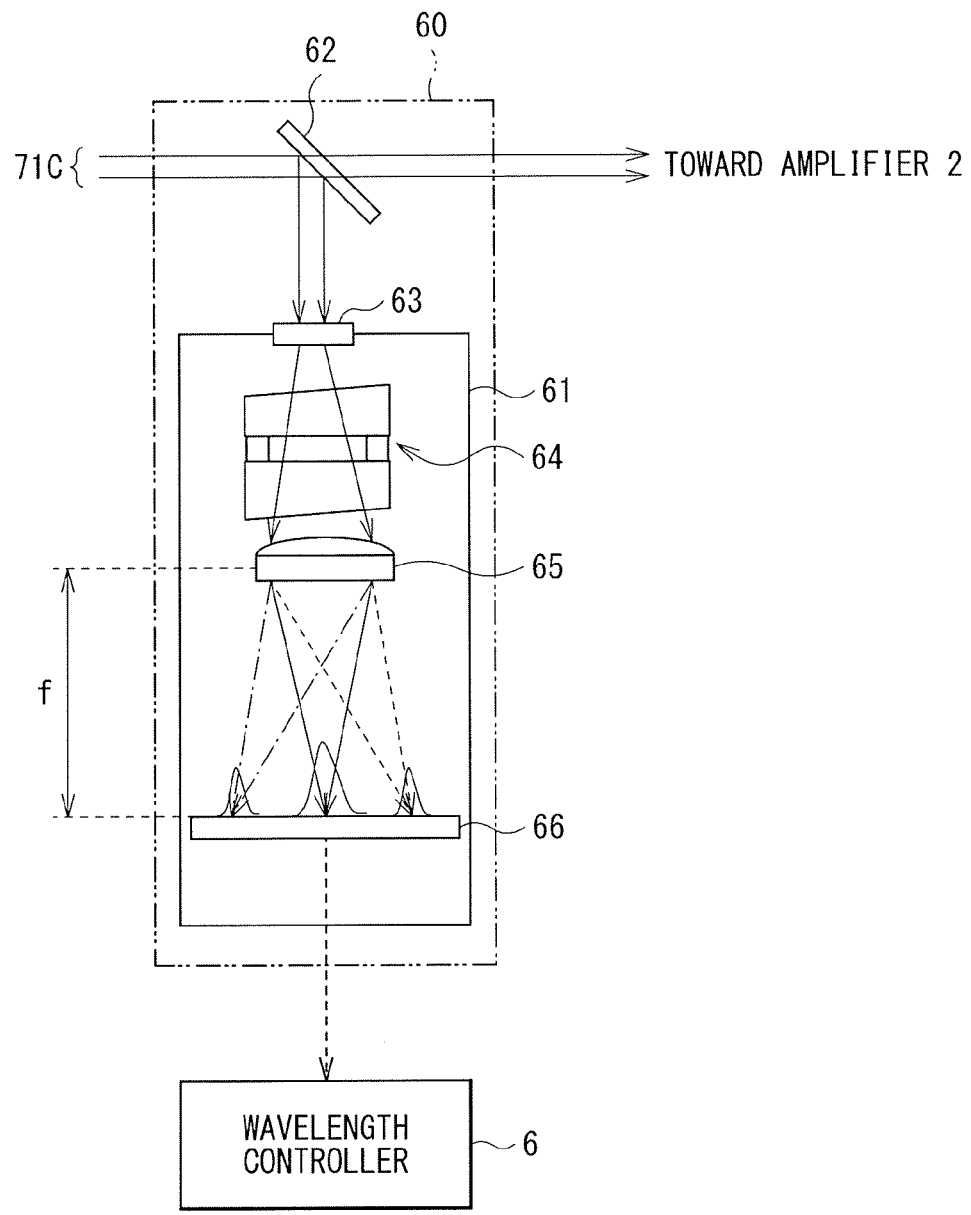
FIG. 20 schematically illustrates a configuration example of a wavelength monitor.

FIG. 20 illustrates a specific configuration example of the wavelength monitor 60. FIG. 20 schematically illustrates a configuration example in a case where the spectrometer 61 in the wavelength monitor 60 is a monitor etalon spectrometer.

The spectrometer 61 may include a diffusion device 63, a monitor etalon 64, a light concentrating lens 65, and an image sensor 66. The image sensor 66 may be a photodiode array.

7.2 Operation

A laser beam reflected by the beam splitter 62 may first enter the diffusion device 63. The diffusion device 63 may scatter the laser beam having entered the diffusion device 63. The thus-scattered laser beam may enter the monitor etalon 64. The laser beam having passed through the monitor etalon 64 may enter the light concentrating lens 65. The laser beam may pass through the light concentrating lens 65, and an interference fringe may be produced on a focal surface of the light concentrating lens 65.

The image sensor 66 may be disposed on the focal surface of the light concentrating lens 65. The laser beam having passed through the light concentrating lens 65 and having been concentrated by the light concentrating lens 65 may produce an interference fringe on the image sensor 66. The image sensor 66 may detect the thus-produced interference fringe. The square of a radius of the interference fringe may be proportional to a wavelength of the laser beam. Accordingly, a spectral line width and a central wavelength of the entire laser beam as a spectrum profile may be detected from the detected interference fringe. The spectral line width and the central wavelength may be determined from the detected interference fringe by an unillustrated information processor, or may be calculated by the wavelength controller 6.

A detected wavelength λ in the image sensor 66 may be determined by the following expression.

$$\lambda = \lambda c + \alpha r m^2$$

where α is a proportionality constant, rm is the radius of the interference fringe, and λc is a wavelength when light intensity at a center of the interference fringe is at maximum.

At this occasion, in some cases, a speckle may occur in the interference fringe detected by the image sensor 66, which may hinder measurement of the interference fringe at high accuracy. In such a case, an integrated interference fringe of a plurality of pulses may be measured by the image sensor 66 while rotating or vibrating the diffusion device 63 to measure an interference fringe with a reduced speckle.

Figure 21:
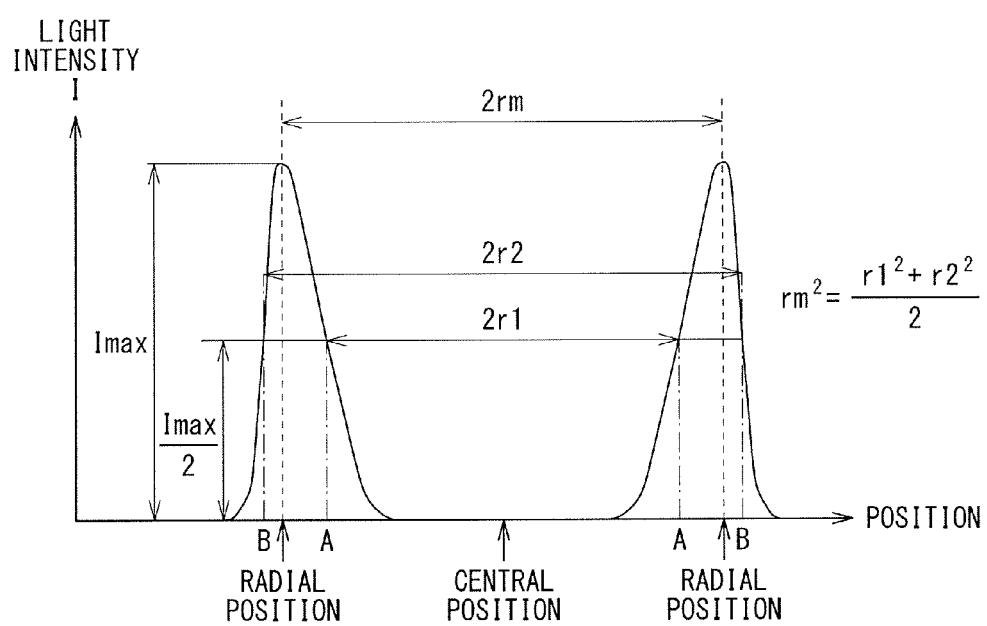
FIG. 21 illustrates an example of a relationship between a position and light intensity of an interference fringe detected by the wavelength monitor illustrated in FIG. 20.

FIG. 21 illustrates an example of a relationship between a position and light intensity of the interference fringe detected by the wavelength monitor 60 illustrated in FIG. 20. A horizontal axis may indicate the position of the interference fringe, and a vertical axis may indicate the light intensity of the interference fringe.

As can be seen from FIG. 21 and the following expression, the square of the radius rm of the interference fringe may be calculated from an average value of the square of a radius r1 inside a position of a half value Imax/2 of the light intensity of the interference fringe and the square of a radius r2 outside the position.

$$rm^2 = (r1^2 + r2^2)/2$$

8. Hardware Environment of Controller

A person skilled in the art will appreciate that a general-purpose computer or a programmable controller may be combined with a program module or a software application to execute any subject matter disclosed herein. The program module, in general, may include one or more of a routine, a program, a component, a data structure, and so forth that each cause any process described in any example embodiment of the present disclosure to be executed.

Figure 22:
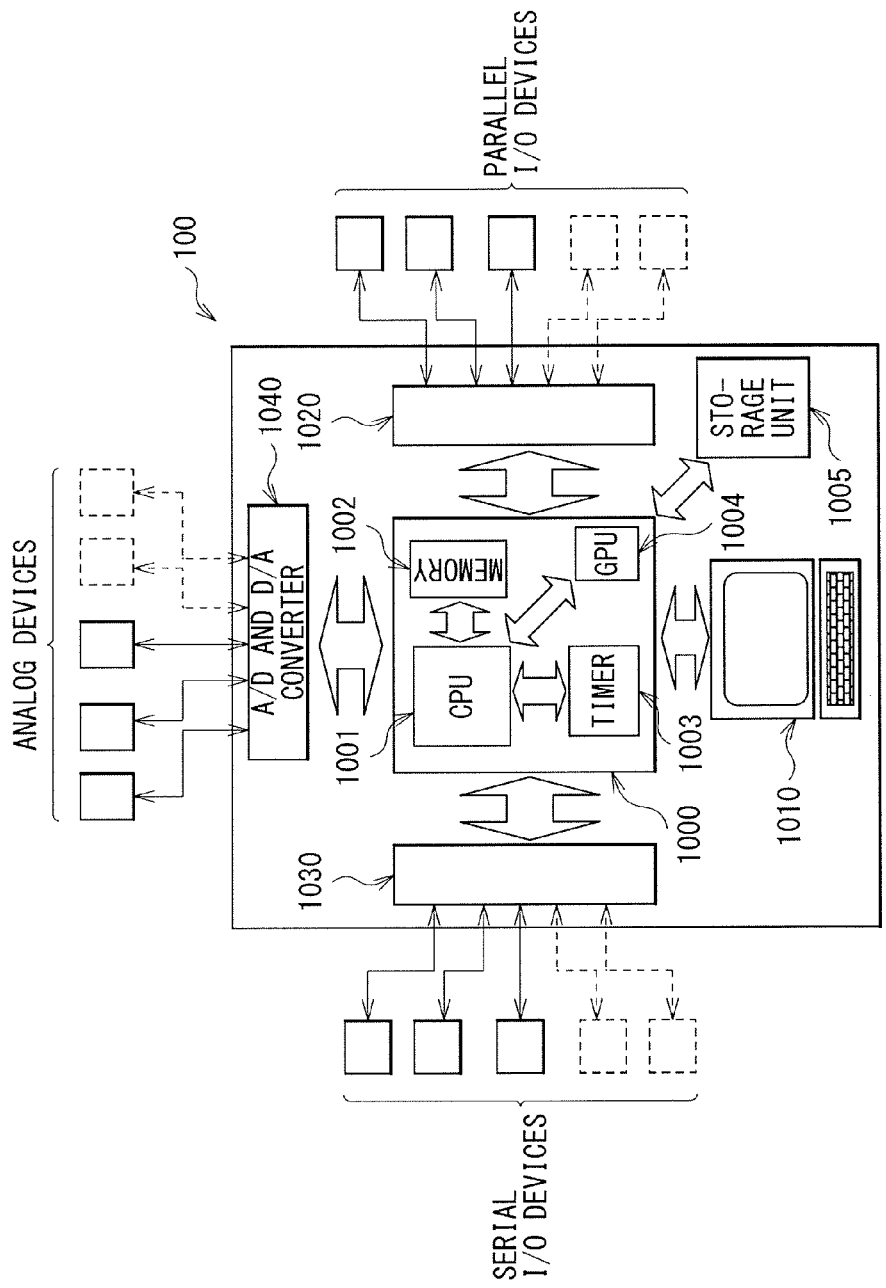
FIG. 22 illustrates an example of a hardware environment of a controller.

FIG. 22 is a block diagram illustrating an exemplary hardware environment in which various aspects of any subject matter disclosed therein may be executed. An exemplary hardware environment 100 in FIG. 22 may include a processing unit 1000, a storage unit 1005, a user interface 1010, a parallel input/output (I/O) controller 1020, a serial I/O controller 1030, and an analog-to-digital (A/D) and digital-to-analog (D/A) converter 1040. Note that the configuration of the hardware environment 100 is not limited thereto.

The processing unit 1000 may include a central processing unit (CPU) 1001, a memory 1002, a timer 1003, and a graphics processing unit (GPU) 1004. The memory 1002 may include a random access memory (RAM) and a read only memory (ROM). The CPU 1001 may be any commercially-available processor. A dual microprocessor or any other multi-processor architecture may be used as the CPU 1001.

The components illustrated in FIG. 22 may be coupled to one another to execute any process described in any example embodiment of the present disclosure.

Upon operation, the processing unit 1000 may load programs stored in the storage unit 1005 to execute the loaded programs. The processing unit 1000 may read data from the storage unit 1005 together with the programs, and may write data in the storage unit 1005. The CPU 1001 may execute the programs loaded from the storage unit 1005. The memory 1002 may be a work area in which programs to be executed by the CPU 1001 and data to be used for operation of the CPU 1001 are held temporarily. The timer 1003 may measure time intervals to output a result of the measurement to the CPU 1001 in accordance with the execution of the programs. The GPU 1004 may process image data in accordance with the programs loaded from the storage unit 1005, and may output the processed image data to the CPU 1001.

The parallel I/O controller 1020 may be coupled to parallel I/O devices operable to perform communication with the processing unit 1000, and may control the communication performed between the processing unit 1000 and the parallel I/O devices. Non-limiting examples of the parallel I/O devices may include the laser controller 3, the wavelength controller 6, the amplifier controller 30, the charger 31, the wavelength monitor 60, and the first and second wavelength monitors 60A and 60B. The serial I/O controller 1030 may be coupled to a plurality of serial I/O devices operable to perform communication with the processing unit 1000, and may control the communication performed between the processing unit 1000 and the serial I/O devices. Non-limiting examples of serial I/O devices may include the laser controller 3, the exposure apparatus controller 5, the wavelength controller 6, and the synchronous circuit 13. The A/D and D/A converter 1040 may be coupled to various kinds of sensors and analog devices through respective analog ports. Non-limiting examples of the analog devices may include the optical shutter 23, the semiconductor optical amplifier 41, and the semiconductor optical amplifier 44. The A/D and D/A converter 1040 may control communication performed between the processing unit 1000 and the analog devices, and may perform analog-to-digital conversion and digital-to-analog conversion of contents of the communication.

The user interface 1010 may provide an operator with display showing a progress of the execution of the programs executed by the processing unit 1000, such that the operator is able to instruct the processing unit 1000 to stop execution of the programs or to execute an interruption routine.

The exemplary hardware environment 100 may be applied to one or more of configurations of the laser controller 3, the wavelength controller 6, and other controllers according to any example embodiment of the present disclosure. A person skilled in the art will appreciate that such controllers may be executed in a distributed computing environment, namely, in an environment where tasks may be performed by processing units linked through any communication network. In any example embodiment of the present disclosure, unillustrated controllers used for an exposure apparatus laser that integrally control controllers such as the laser controller 3 and the wavelength controller 6 may be coupled to one another through a communication network such as Ethernet (Registered Trademark) or the Internet. In the distributed computing environment, the program module may be stored in each of local and remote memory storage devices.

9. Et Cetera

The foregoing description is intended to be merely illustrative rather than limiting. It should therefore be appreciated that variations may be made in example embodiments of the present disclosure by persons skilled in the art without departing from the scope as defined by the appended claims.

The terms used throughout the specification and the appended claims are to be construed as "open-ended" terms. For example, the term "include" and its grammatical variants are intended to be non-limiting, such that recitation of items in a list is not to the exclusion of other like items that can be substituted or added to the listed items. The term "have" and its grammatical variants are intended to be non-limiting, such that recitation of items in a list is not to the exclusion of other like items that can be substituted or added to the listed items. Also, the singular forms "a", "an", and "the" used in the specification and the appended claims include plural references unless expressly and unequivocally limited to one referent.

What is claimed is:

1. A solid-state laser system, comprising:
a first solid-state laser unit configured to output a first pulsed laser light beam with a first wavelength generated on a basis of first seed light;
a second solid-state laser unit configured to output a second pulsed laser light beam with a second wavelength generated on a basis of second seed light;
a wavelength conversion system configured to receive the first pulsed laser light beam and the second pulsed laser light beam, and output a third pulsed laser light beam with a third wavelength that is converted from the first wavelength and the second wavelength;
a wavelength detector configured to detect a value of the third wavelength; and
a wavelength controller configured to control the first solid-state laser unit to vary the first wavelength on a condition that an absolute value of a difference between a value of a target wavelength and the value of the third wavelength detected by the wavelength detector is equal to or less than a predetermined value, and control the second solid-state laser unit to vary the second wavelength on a condition that the absolute value of the difference exceeds the predetermined value.

2. The solid-state laser system according to claim 1, wherein the wavelength detector includes a wavelength monitor provided in an optical path of the third pulsed laser light beam.

3. The solid-state laser system according to claim 1, wherein the wavelength detector includes:
a first wavelength monitor provided in an optical path of the first seed light;
a second wavelength monitor provided in an optical path of the second seed light; and
a calculation section configured to calculate the value of the third wavelength from a value measured by the first wavelength monitor and a value measured by the second wavelength monitor.

4. The solid-state laser system according to claim 1, wherein a variation range of the first wavelength in the first solid-state laser unit is narrower than a variation range of the second wavelength in the second solid-state laser unit.

5. The solid-state laser system according to claim 1, wherein the first wavelength is shorter than the second wavelength.

6. The solid-state laser system according to claim 1, wherein a variation velocity of the first wavelength in the first solid-state laser unit is higher than a variation velocity of the second wavelength in the second solid-state laser unit.

7. The solid-state laser system according to claim 1, wherein the first solid-state laser unit includes a nonlinear crystal provided in an optical path of the first seed light.

8. The solid-state laser system according to claim 1, wherein the first solid-state laser unit includes an external cavity laser diode configured to output the first seed light.

9. The solid-state laser system according to claim 1, wherein the second solid-state laser unit includes a distributed-feedback laser diode configured to output the second seed light.

10. The solid-state laser system according to claim 1, wherein the wavelength conversion system includes:
a nonlinear crystal configured to output converted light with a predetermined wavelength converted on a basis of first entering light and second entering light; and
a rotation mechanism configured to vary an entry angle of each of the first entering light and the second entering light to the nonlinear crystal.

11. The solid-state laser system according to claim 10, further comprising:
a photodetector; and
a rotation controller,
the nonlinear crystal being configured to output light with a wavelength different from the predetermined wavelength as well,
the photodetector being provided in an optical path of the light with the wavelength different from the predetermined wavelength, and
the rotation controller being configured to control the rotation mechanism to change a detection value derived from the photodetector smaller, the detection value being associated with the light with the wavelength different from the predetermined wavelength.

12. The solid-state laser system according to claim 10, further comprising:
a photodetector provided in an optical path of the converted light; and
a rotation controller configured to control the rotation mechanism to change a detection value derived from the photodetector larger, the detection value being associated with the converted light.

13. The solid-state laser system according to claim 1, wherein
a variation range of the first wavelength in the first solid-state laser unit includes a wavelength of 257.5 m, and
a variation range of the second wavelength in the second solid-state laser unit includes a wavelength of 1554 nm.

14. The solid-state laser system according to claim 1, wherein the wavelength conversion system includes a CLBO crystal.

15. A laser apparatus used for an exposure apparatus, the laser apparatus comprising:
a first solid-state laser unit configured to output a first pulsed laser light beam with a first wavelength generated on a basis of first seed light;
a second solid-state laser unit configured to output a second pulsed laser light beam with a second wavelength generated on a basis of second seed light;
a wavelength conversion system configured to receive the first pulsed laser light beam and the second pulsed laser light beam, and output a third pulsed laser light beam with a third wavelength that is converted from the first wavelength and the second wavelength;
a wavelength detector configured to detect a value of the third wavelength;
a wavelength controller configured to control the first solid-state laser unit to vary the first wavelength on a condition that an absolute value of a difference between a value of a target wavelength and the value of the third wavelength detected by the wavelength detector is equal to or less than a predetermined value, and control the second solid-state laser unit to vary the second wavelength on a condition that the absolute value of the difference exceeds the predetermined value; and
an amplifier provided in an optical path of the third pulsed laser light beam.

16. The laser apparatus according to claim 15, wherein the wavelength detector includes a wavelength monitor provided in the optical path of the third pulsed laser light beam amplified by the amplifier.

17. The laser apparatus according to claim 15, wherein
a variation range of the first wavelength in the first solid-state laser unit includes a wavelength of 257.5 m, and
a variation range of the second wavelength in the second solid-state laser unit includes a wavelength of 1554 nm.

18. The laser apparatus according to claim 15, wherein the wavelength conversion system includes a CLBO crystal.

* * * * *